(12) United States Patent
Foote et al.

(10) Patent No.: US 7,772,653 B1
(45) Date of Patent: Aug. 10, 2010

(54) SEMICONDUCTOR APPARATUS COMPRISING BIPOLAR TRANSISTORS AND METAL OXIDE SEMICONDUCTOR TRANSISTORS

(75) Inventors: Richard W. Foote, Kennedale, TX (US); Robert Oliver, Louisville, CO (US)

(73) Assignee: National Semiconductor Corporation, Santa Clara, CA (US)

( * ) Notice: Subject to any disclaimer, the term of this patent is extended or adjusted under 35 U.S.C. 154(b) by 435 days.

(21) Appl. No.: 10/777,012

(22) Filed: Feb. 11, 2004

(51) Int. Cl.
*H01L 29/96* (2006.01)

(52) U.S. Cl. ............................... 257/370; 257/E29.293; 438/202

(58) Field of Classification Search .................. 438/202, 438/203, 234; 257/370, 378, E29.293, E21.696
See application file for complete search history.

(56) References Cited

U.S. PATENT DOCUMENTS

| | | | |
|---|---|---|---|
| 4,318,751 A | 3/1982 | Horng | |
| 4,475,279 A * | 10/1984 | Gahle | 438/207 |
| 4,545,087 A | 10/1985 | Nahum | |
| 4,735,916 A * | 4/1988 | Homma et al. | 438/234 |
| 4,784,971 A * | 11/1988 | Chiu et al. | 438/207 |
| 4,887,142 A * | 12/1989 | Bertotti et al. | 257/338 |
| 4,902,640 A * | 2/1990 | Sachitano et al. | 438/202 |
| 4,922,318 A | 5/1990 | Thomas et al. | |
| 4,960,726 A * | 10/1990 | Lechaton et al. | 438/234 |
| 5,011,784 A * | 4/1991 | Ratnakumar | 438/203 |
| 5,017,995 A * | 5/1991 | Soejima | 257/370 |
| 5,028,557 A * | 7/1991 | Tsai et al. | 438/202 |
| 5,037,768 A | 8/1991 | Cosentino | |
| 5,091,760 A * | 2/1992 | Maeda et al. | 257/370 |
| 5,104,816 A | 4/1992 | Verret et al. | |
| 5,108,945 A * | 4/1992 | Matthews | 438/384 |
| 5,141,891 A | 8/1992 | Arima et al. | |
| 5,294,558 A | 3/1994 | Subbanna | |
| 5,340,751 A * | 8/1994 | Maeda et al. | 438/234 |
| 5,943,564 A * | 8/1999 | Chen et al. | 438/202 |
| 6,441,441 B1 * | 8/2002 | Suda | 257/370 |
| 6,472,324 B2 | 10/2002 | Kusakabe et al. | |
| 2001/0005608 A1 * | 6/2001 | Johansson et al. | 438/202 |

OTHER PUBLICATIONS

S. Wolf, "Silicon Processing for the VLSI Era: The Submicron MOSFET," 1995, vol. 3, pp. 641-642.*
M. Shimizu et al., "A Novel Polysilicon Source/Drain Transistor with Self-Aligned Silicidation", LSI R&D Laboratory, Mitsubishi Electric Corporation, pp. 11-12.
S. Hsia et al., "Polysilicon Oxidation Self-Aligned MOS (POSA MOS)—A New Self-Aligned Double Source/Drain Ion Implantation Technique for VLSI", IEEE Electron Device Letters, vol. EDL-3, No. 2. Feb. 1982. pp. 40-42.
Kamal Rajkanan et al., "A High-Performance BICMOS Technology with Double-Polysilicon Self-Aligned Bipolar Devices", IEEE Electron Device Letters, vol. EDL-8, No. 11, Nov. 1987, pp. 509-511.

(Continued)

*Primary Examiner*—Steven J Fulk

(57) ABSTRACT

A method for manufacturing a semiconductor apparatus is disclosed. The apparatus comprises double poly bipolar transistors and double poly metal oxide semiconductor (MOS) transistors. The bipolar transistors and the MOS transistors are manufactured in a unified process in which a first polysilicon layer (Poly1) is doped to form the extrinsic bases in the bipolar transistors and to form the gates in the MOS transistors. A second polysilicon layer (Poly2) is doped to form emitters in the bipolar transistors and to form the sources and drains in the MOS transistors. The method of the invention minimizes the number of manufacturing process steps.

21 Claims, 27 Drawing Sheets

OTHER PUBLICATIONS

Tiao-Yuan Huang et al., "A MOS Transistor with Self-Aligned Polysilicon Source-Drain", IEEE Electron Device Letters, vol. EDL-7, No. 5, May 1986, pp. 314-316.

C. S. Oh et al., "A New MOSFET Structure with Self-Aligned Polysilicon Source and Drain Electrodes", IEEE Electron Device Letters, vol. EDL-5, No. 10, Oct. 1984, pp. 400-402.

W. Josquin et al., "The Integration of Double-Polysilicon NPN Transistors in an Analog BiCMOS Process", Extended Abstracts of the 20th (1988 International) Conference on Solid State Devices and Materials, Tokyo, 1988 pp. 149-152.

Tunenori Yamauchi et al., "High Speed BICMOS Technology with Emitter-base Self-aligned Structure", Bipolar IC Division Fujitsu Limited, pp. 155-158.

Kwang Soo Kim et al., Bipolar-Complementary-Metal-Oxide-Semiconductor (BiCMOS) Technology with Polysilicon Self-Aligned Bipolar Devices, Japanese Journal of Applied Physics, vol. 30, No. 10, Oct. 1991, pp. 2459-2465.

Masahiro Shimizu et al., "A Novel CMOS Structure with Polysilicon Source/Drain (PSD) Transistors by Self-Aligned Silicidation", IEICE Trans. Electron, vol. E76-C, No. 4, Apr. 1993, pp. 532-540.

M. K. Moravvej-Farshi et al., Novel Self-Aligned Polysilicon-Gate MOSFETS with Polysilicon Source and Drain, Solid-State Electronics, vol. 30, No. 10, 1987, pp. 1053-1062.

W. R. Burger et al., "An Advanced Self-Aligned BiCMOS Technology for High Performance 1-MegaBit ECL I/O SRAM's", National Semiconductor Corp., Puyallup Technology Development, 1989.

James Warnock et al., "BiCMOS Technology with 60-Ghz n-p-n Bipolar and 0.25-µm CMOS", IEEE Electron Device Letters, vol. 13, No. 11, Nov. 1992, pp. 578-580.

J. D. Hayden et al., "Integration of a Double Polysilicon, Fully Self-Aligned Bipolar Transistor into a 0.5µm BiCMOS Technology for Fast 4MBit SRAMs", Advanced Products Research and Development Laboratory, Motorola Inc., IEEE 1991 Bipolar Circuits and Technology Meeting, pp. 17-20.

T. C. Mele et al., "A High Performance 0.5µm BiCMOS Triple Polysilicon Technology for 4mb Fast SRAMs", Advanced Products Research and Development Laboratory, Motorola Inc., IEEE 1990.

Kenneth O'Peter Garone et al., "A Double-Polysilicon Self-Aligned npn Bipolar Process (ADRF) with Optional NMOS Transistors for RF and Microwave Applications", 1994 Bipolar/BiCMOS Circuits & Technology Meeting, pp. 221-224.

Alain Chantre et al., "Identification of a Corner Tunneling Current Component in Advanced CMOS-Compatible Bipolar Transistors", IEEE Transactions on Electron Devices, vol. 38, No. 1, Jan. 1991, pp. 107-110.

K. Ishimaru et al., "Bipolar Installed CMOS Technology without Any Process Step Increase for High Speed Cache SRAM", IEEE 1995.

Shih Wei Sun et al., "Selective-Polysilicon Emitter, Self-Aligned Bipolar Structure for BiCMOS VLSI Applications", Motorola Inc., Advanced Products Research and Development Laboratory, pp. 55-56.

Tzu-Yin Chin et al., "The Design and Characterization of Nonoverlapping Super Self-Aligned BiCMOS Technology", IEEE Transactions on Electron Devices, vol. 38, No. 1, Jan. 1991, pp. 141-150.

Tadanori Yamaguchi et al., "Process Integration and Device Performance of a Submicrometer BiCMOS with 16-Ghz ft Double Poly-Bipolar Devices", IEEE Transactions on Electron Devices, vol. 36, No. 5, May 1989, pp. 890-896.

T. Yuzuriha et al., "Submicron Bipolar-CMOS Technology Using 16 Ghz ft Double Poly-SI Bipolar Devices", Tektronix, Inc. IEEE 1988, pp. 748-751.

T. Yoshimura et al., "0.6 µm High Speed BICMOS Technology with Emitter-Base Self-Aligned Structure", Fujitsu Limited, Bipolar IC Division, IEEE 1989, pp. 241-244.

K. G. Moerschel et al., "Best: A BiCMOS-Compatible Super-Self-Aligned ECL Technology", AT&T Microelectronics, AT&T Bell Laboratories, IEEE 1990 Custom Integrated Circuits Conference, pp. 18.3.1-18.3.4.

* cited by examiner

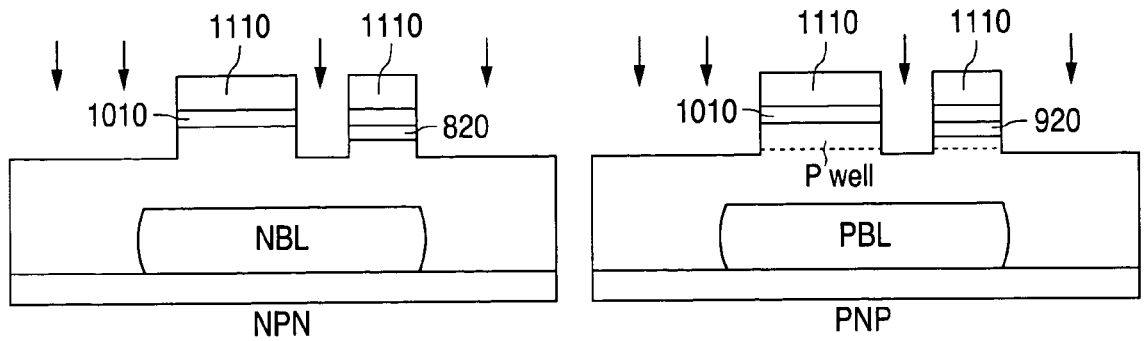
FIG. 11A  FIG. 11B
FIG. 11C  FIG. 11D
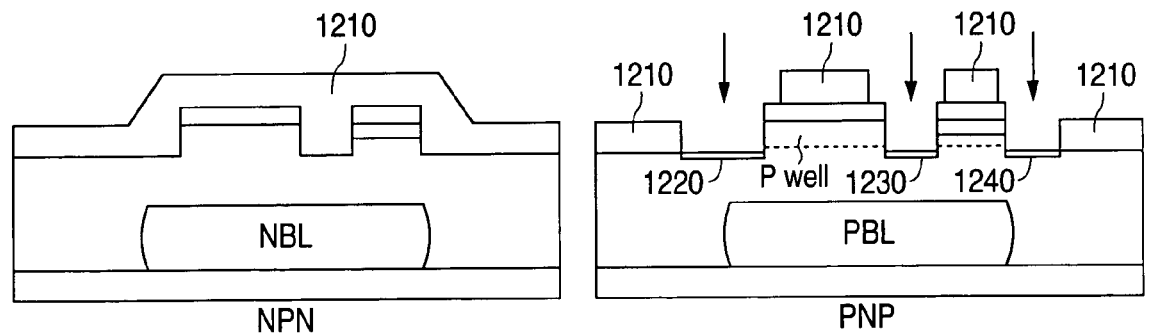
FIG. 12A  FIG. 12B
FIG. 12C  FIG. 12D

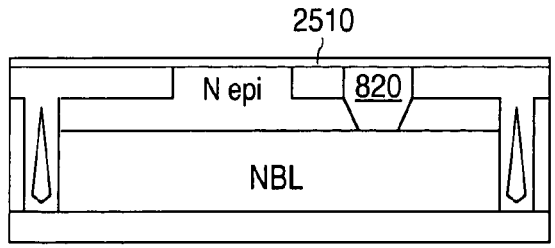
FIG. 25A NPN
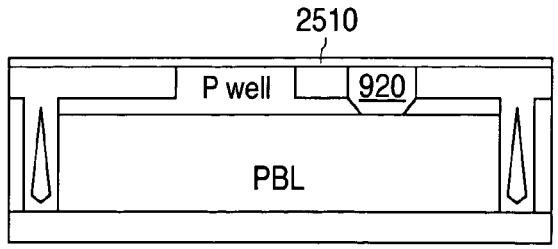
FIG. 25B PNP
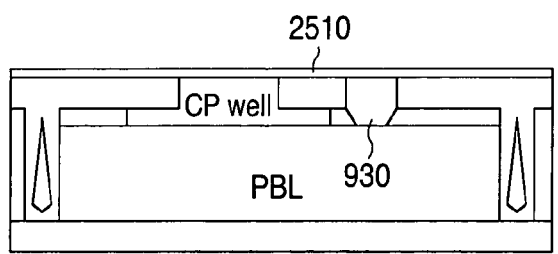
FIG. 25C NMOS
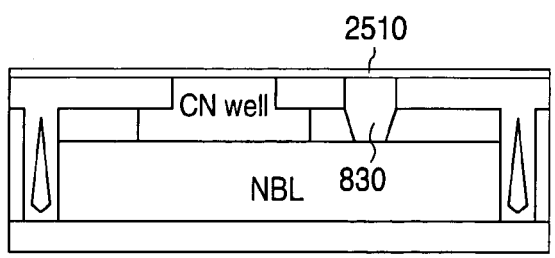
FIG. 25D PMOS
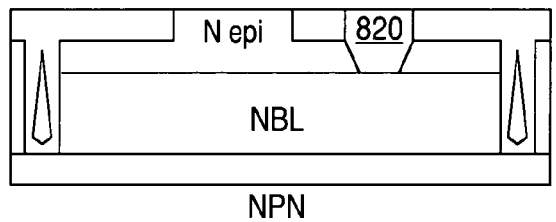
FIG. 26A NPN
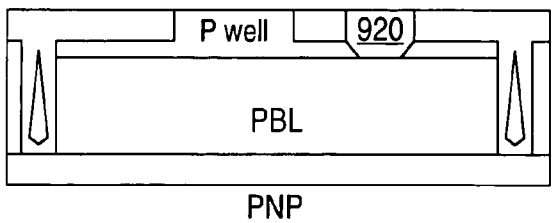
FIG. 26B PNP
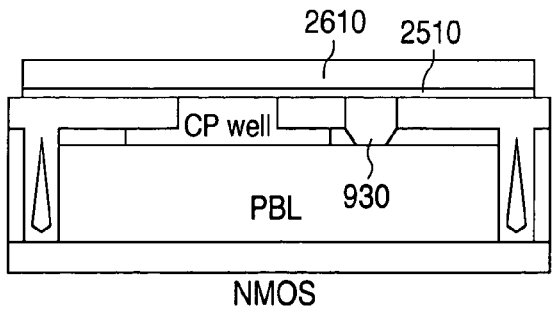
FIG. 26C NMOS
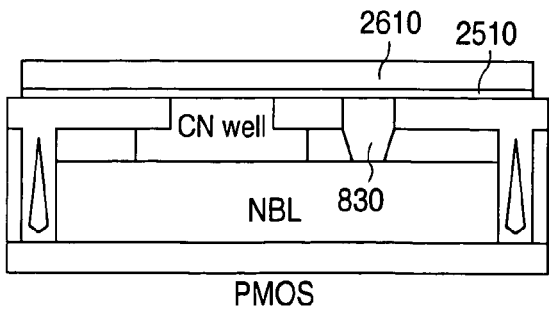
FIG. 26D PMOS

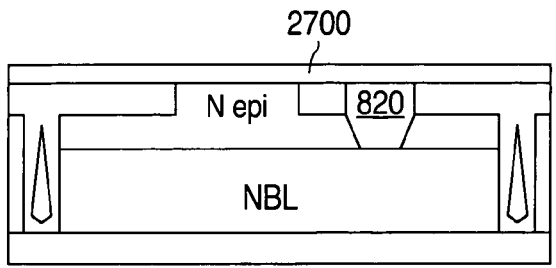
FIG. 27A NPN
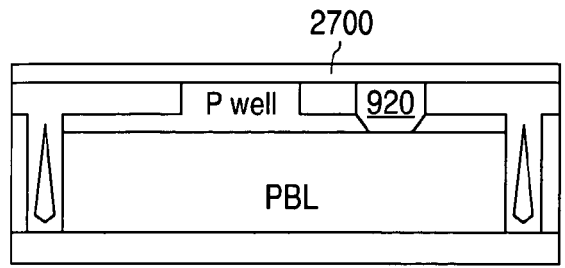
FIG. 27B PNP
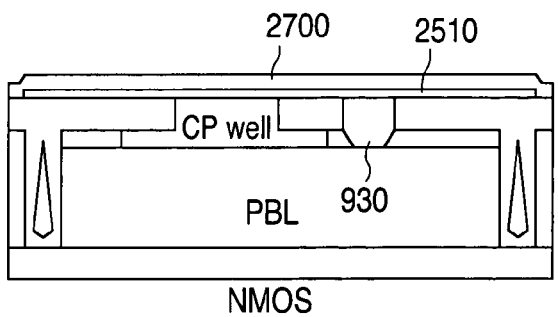
FIG. 27C NMOS
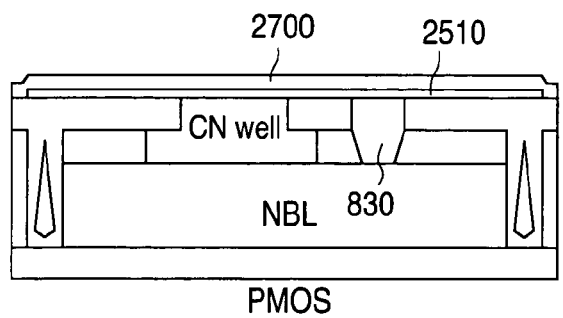
FIG. 27D PMOS
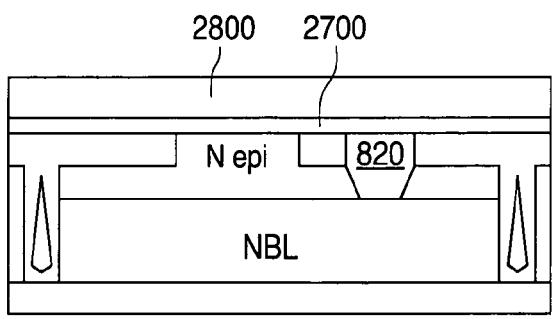
FIG. 28A NPN
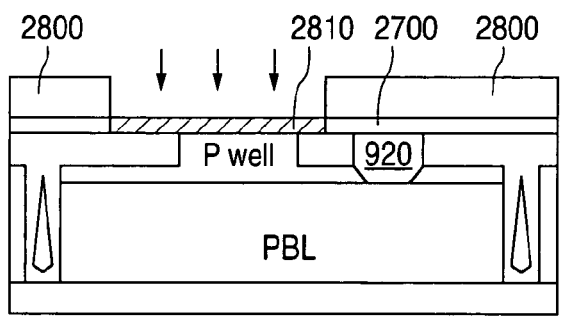
FIG. 28B PNP
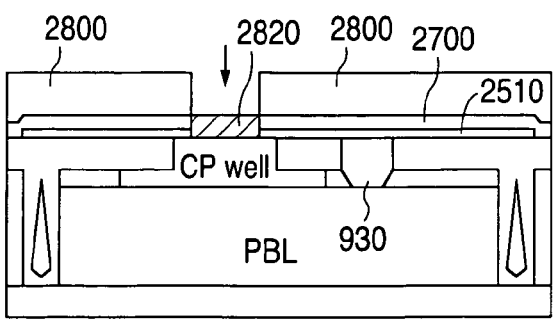
FIG. 28C NMOS
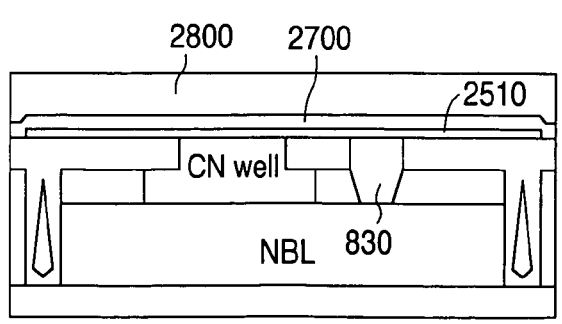
FIG. 28D PMOS

NPN

PNP

NMOS

PMOS

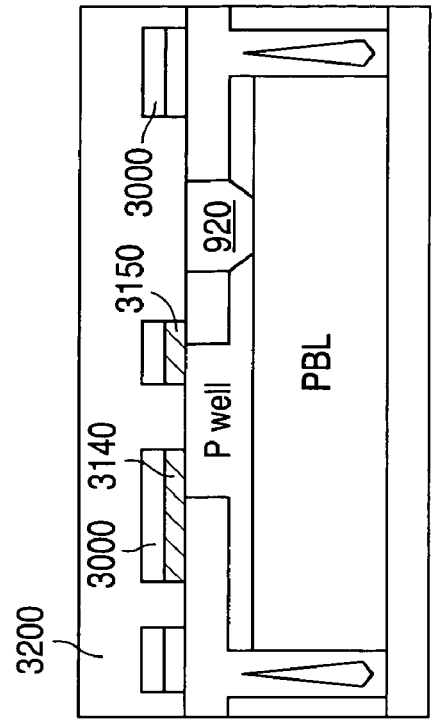
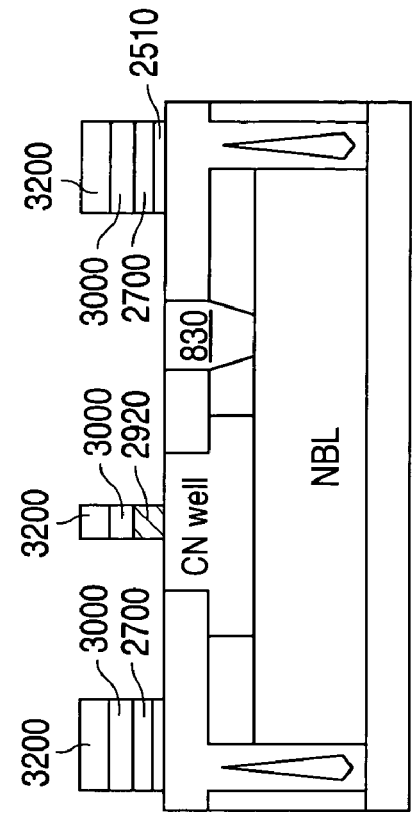
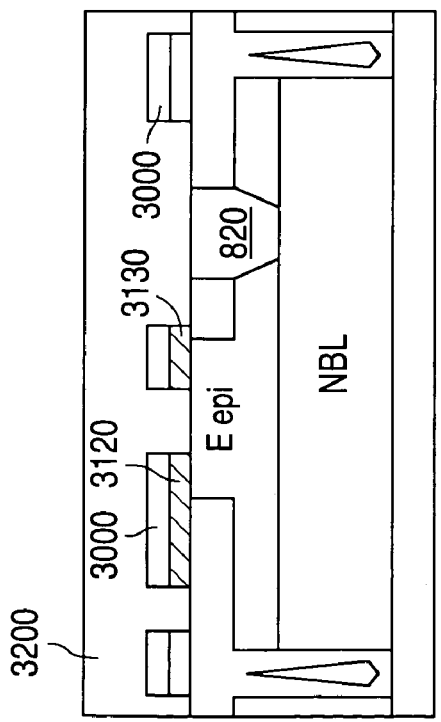
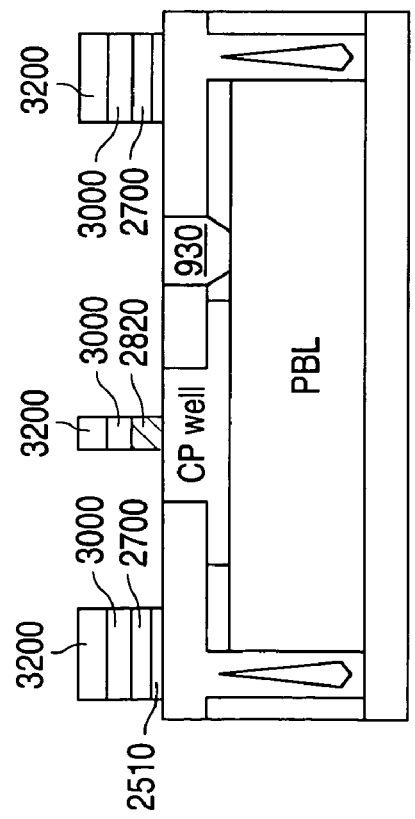

PNP

PMOS

NPN

NMOS

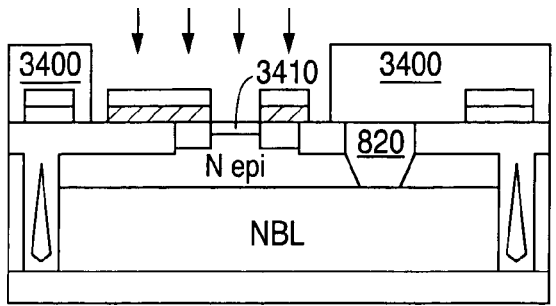
FIG. 34A NPN
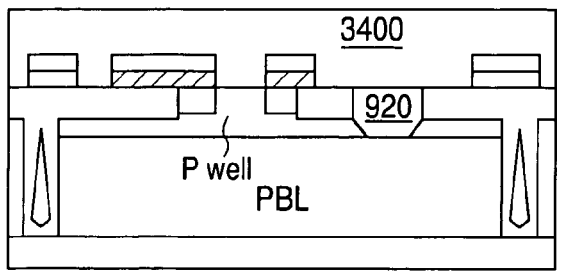
FIG. 34B PNP
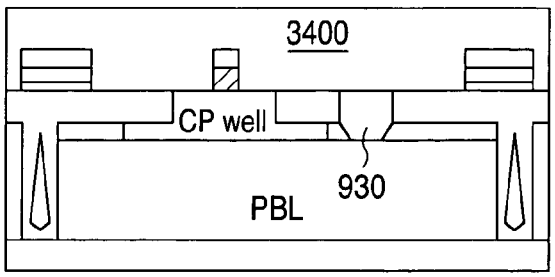
FIG. 34C NMOS
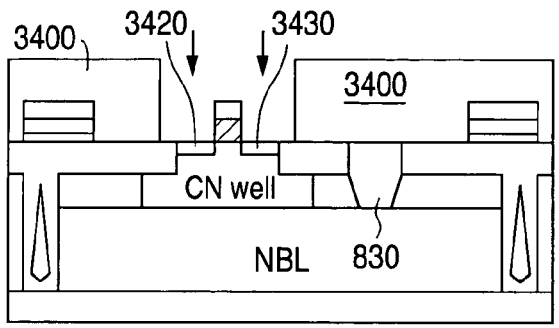
FIG. 34D PMOS
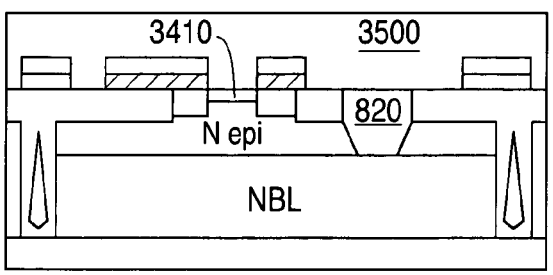
FIG. 35A NPN
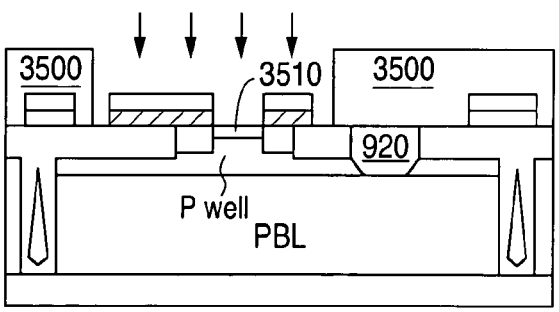
FIG. 35B PNP
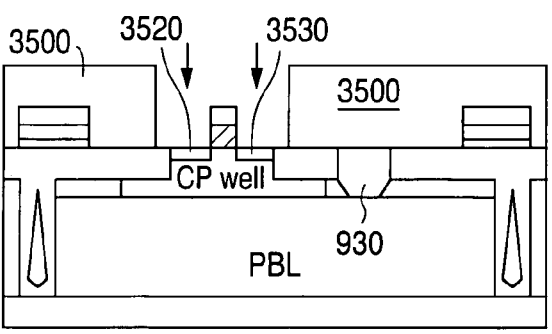
FIG. 35C NMOS
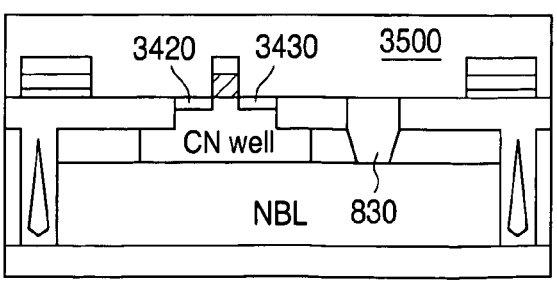
FIG. 35D PMOS

NPN

PNP

NMOS

PMOS

NPN

PNP

NMOS

PMOS

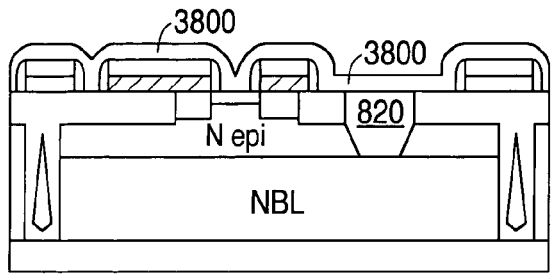
FIG. 38A NPN
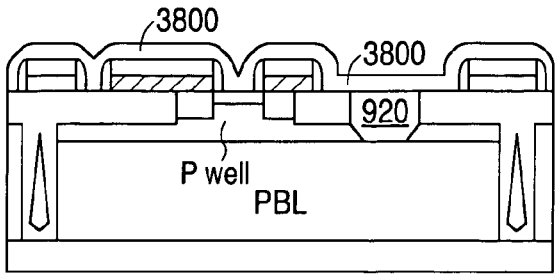
FIG. 38B PNP
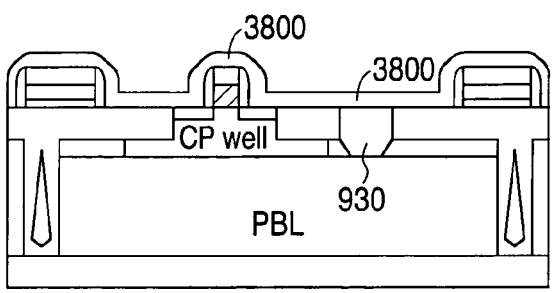
FIG. 38C NMOS
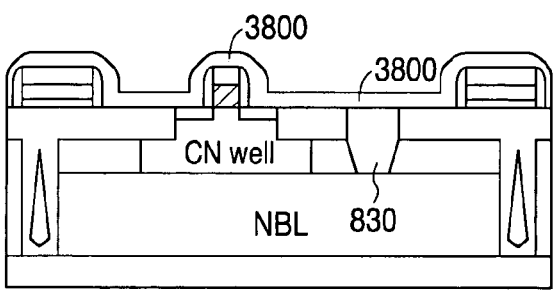
FIG. 38D PMOS
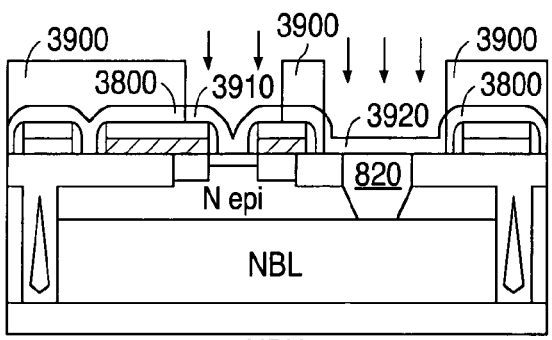
FIG. 39A NPN
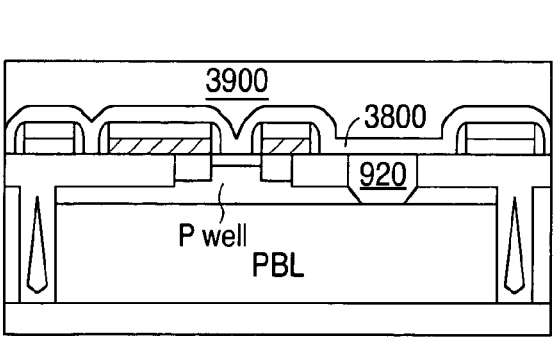
FIG. 39B PNP
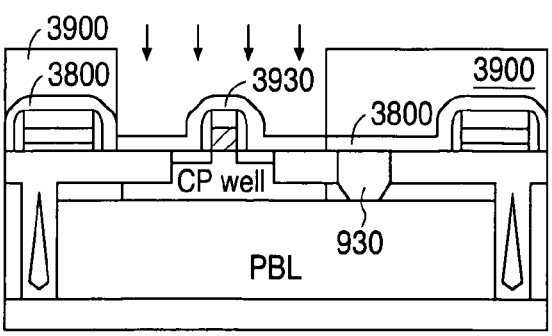
FIG. 39C NMOS
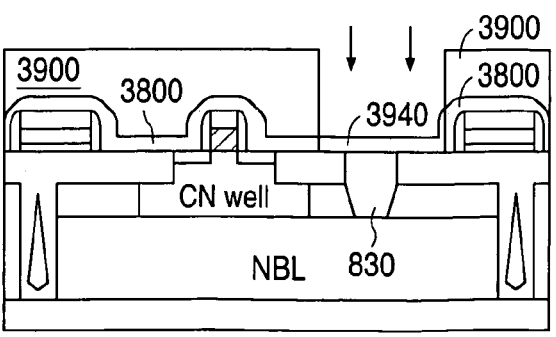
FIG. 39D PMOS

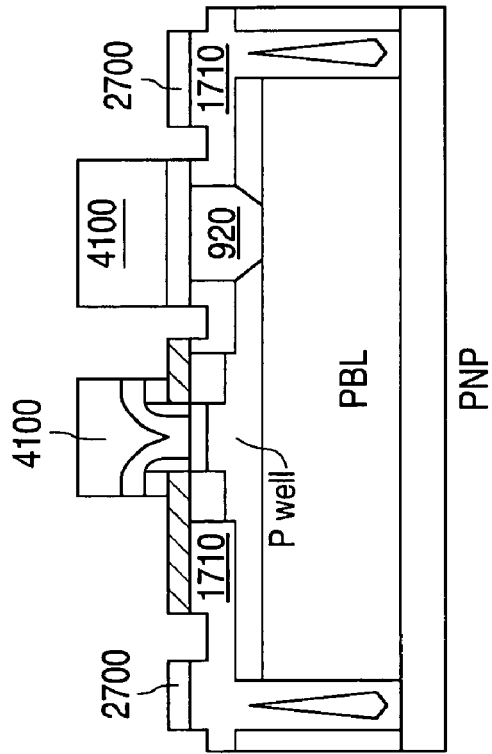
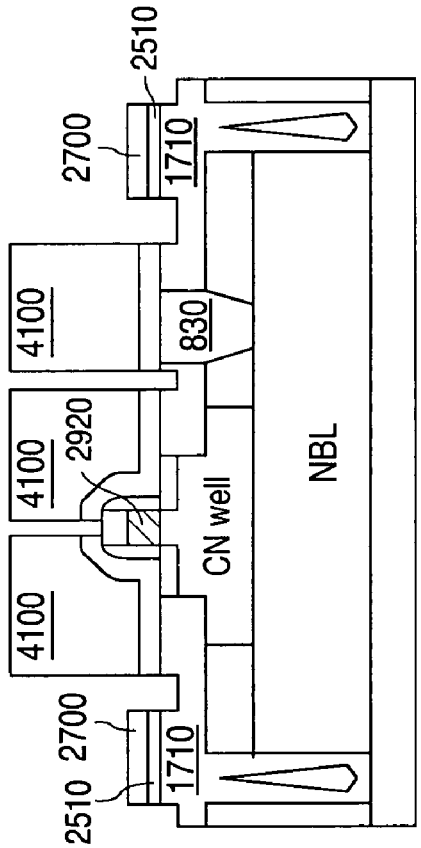
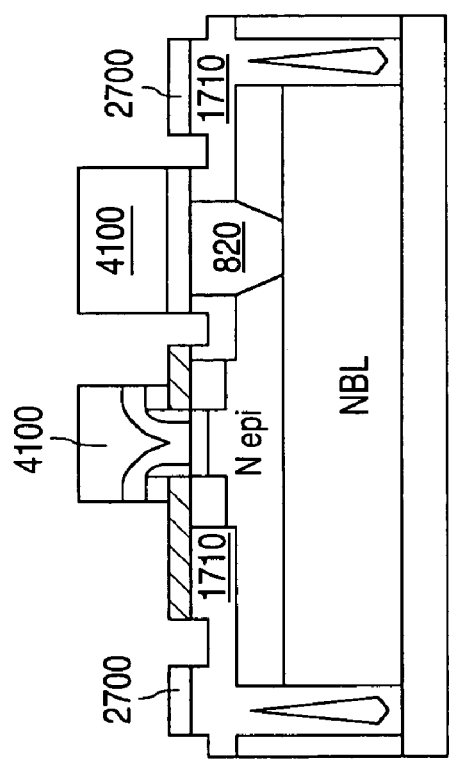
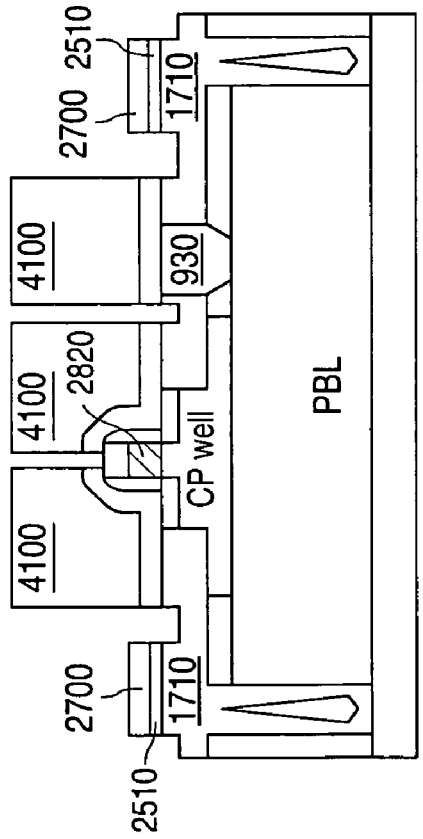

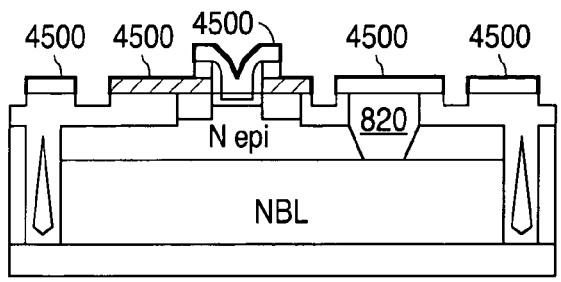
FIG. 45A NPN
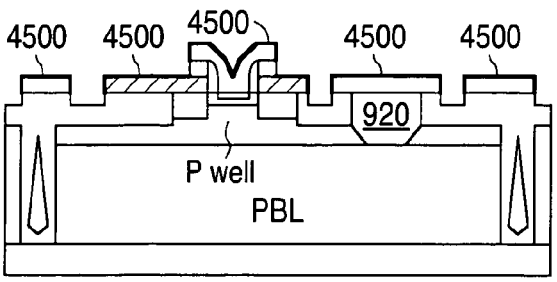
FIG. 45B PNP
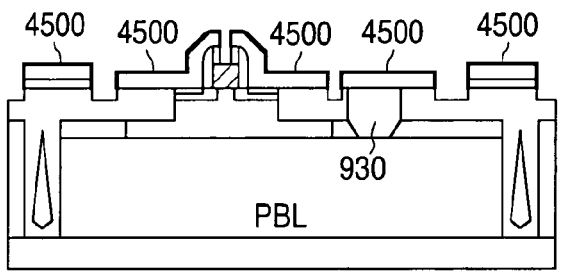
FIG. 45C NMOS
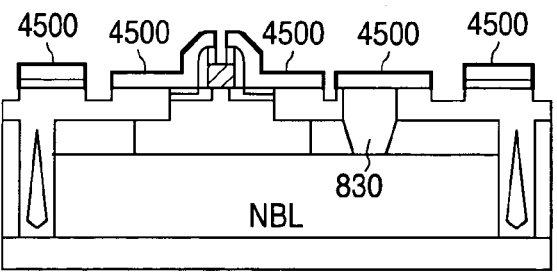
FIG. 45D PMOS
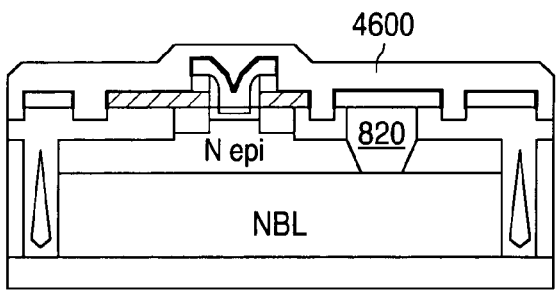
FIG. 46A NPN
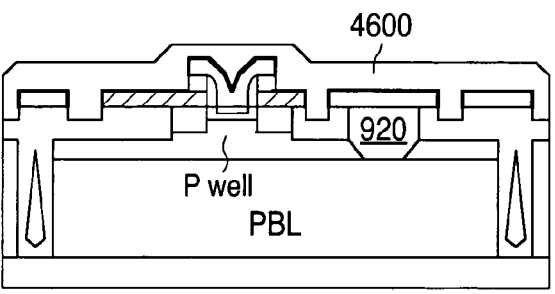
FIG. 46B PNP
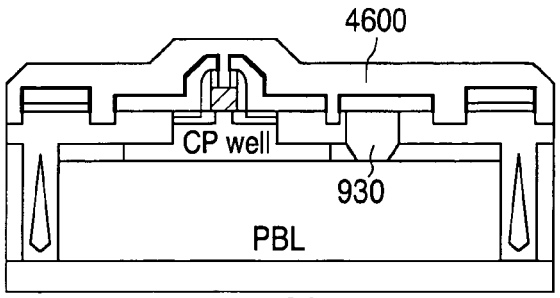
FIG. 46C NMOS
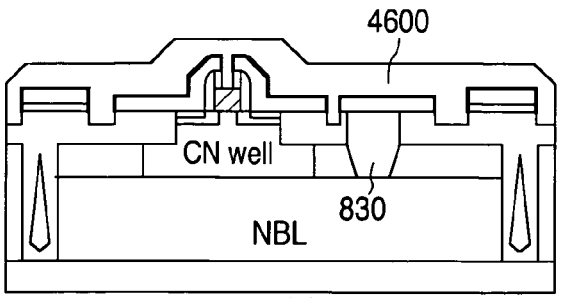
FIG. 46D PMOS

SEMICONDUCTOR APPARATUS COMPRISING BIPOLAR TRANSISTORS AND METAL OXIDE SEMICONDUCTOR TRANSISTORS

TECHNICAL FIELD OF THE INVENTION

The present invention is generally directed to semiconductor technology and, in particular, to a method for manufacturing a semiconductor apparatus that comprises both bipolar transistors and metal oxide semiconductor transistors.

BACKGROUND OF THE INVENTION

In recent years, there have been great advancements in the speed, power, and complexity of integrated circuits. Some integrated circuits comprise both bipolar transistors, such as PNP transistors and NPN transistors, and metal oxide semiconductor (MOS) transistors, such as PMOS transistors and NMOS transistors. When integrated circuit devices are manufactured, different types of steps may be employed for manufacturing the two different types of transistors.

The process for manufacturing bipolar transistors in an integrated circuit (sometimes referred to as a control flow process) involves the performance of a number of different types of steps. It is desirable that the steps for manufacturing MOS transistors on the same integrated circuit as the bipolar transistors be compatible with the steps for manufacturing the bipolar transistors.

Therefore, there is a need in the art for an efficient method for combining the manufacturing steps of bipolar transistors and MOS transistors in the same integrated circuit. In particular, there is a need in the art for an improved method that is capable of efficiently manufacturing bipolar transistors and MOS transistors in a unified control flow process.

SUMMARY OF THE INVENTION

To address the above-discussed deficiencies of the prior art, it is a primary object of the present invention to provide an efficient method of combining the manufacturing steps for bipolar transistors and the manufacturing steps for MOS transistors in the same integrated circuit.

The semiconductor apparatus of the present invention comprises double poly bipolar transistors and merged poly metal oxide semiconductor (MOS) transistors. The bipolar transistors and the MOS transistors are manufactured in a unified process in which a first polysilicon layer (Poly1) is doped to form the extrinsic bases in the bipolar transistors and to form the gates in the MOS transistors. The first polysilicon layer (Poly1) is patterned and etched to open a hole for the poly emitter in the bipolar transistors and to define the gate electrode in the MOS transistors. Resist material is applied and patterned and implants are performed to form the intrinsic bases of the bipolar transistors and the Lightly Doped Drains (LDD) of the MOS transistors. An advantage of this method over the prior art is that the LDDs are self aligned to the gate edge.

A dielectric layer is deposited and anisotropically etched to form spacers on the inside of the hole for the emitters of the bipolar transistors and on the outside of the gate poly for the bipolar transistors. This creates a space between the heavily doped emitter and the heavily doped extrinsic base of the bipolar transistors and between the heavily doped sources and drains of the MOS transistors and the channel region of the MOS transistors. Persons who are skilled in the art will recognize the advantage of this spacing arrangement.

A second polysilicon layer (Poly2) is doped to form emitters in the bipolar transistors and to form the sources and drains in the MOS transistors. The method of the invention minimizes the number of manufacturing process steps.

It is an object of the present invention to provide a method for efficiently combining the manufacturing steps for bipolar transistors and the manufacturing steps for MOS transistors in the same integrated circuit.

It is also an object of the present invention to provide a method for efficiently combining the manufacturing steps for bipolar transistors and the manufacturing steps for MOS transistors in a unified process.

It is another object of the present invention to provide a method for doping a first polysilicon layer (Poly1) in a semiconductor apparatus to form extrinsic bases in bipolar transistors and to form gates in MOS transistors in the semiconductor apparatus.

It is another object of the present invention to provide a method for removing the first polysilicon layer (Poly1) from certain areas that are then doped to form the intrinsic bases of the bipolar transistors and the Lightly Doped Drains (LDDs) of the MOS transistors.

It is also another object of the present invention to provide a method for self aligning the intrinsic bases to the extrinsic bases and emitter of the bipolar transistors and the Lightly Doped Drains (LDDs) to the channel and source drains of the MOS transistors.

It is still another object of the present invention to provide a method for doping a second polysilicon layer (Poly2) in a semiconductor apparatus to form emitters in bipolar transistors and to form sources and drains in MOS transistors in the semiconductor apparatus.

It is also an object of the present invention to provide a method for efficiently combining the manufacturing steps for bipolar transistors and the manufacturing steps for MOS transistors in the same integrated circuit that minimizes the number of manufacturing process steps.

The foregoing has outlined rather broadly the features and technical advantages of the present invention so that those persons who are skilled in the art may better understand the detailed description of the invention that follows. Additional features and advantages of the invention will be described hereinafter that form the subject of the claims of the invention. Persons who are skilled in the art should appreciate that they may readily use the conception and the specific embodiment disclosed as a basis for modifying or designing other structures for carrying out the same purposes of the present invention. Persons who are skilled in the art should also realize that such equivalent constructions do not depart from the spirit and scope of the invention in its broadest form.

Before undertaking the Detailed Description of the Invention below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those persons of ordinary skill in the art should understand that in many, if not most instances, such definitions apply to prior uses, as well as future uses, of such defined words and phrases.

BRIEF DESCRIPTION OF THE DRAWINGS

For a more complete understanding of the present invention and its advantages, reference is now made to the following description taken in conjunction with the accompanying drawings, in which like reference numerals represent like parts:

FIG. 2 also illustrates an implant procedure for forming an NPN buried layer (NBL) in the NPN device and in the PMOS device;

FIG. 11 illustrates the result of performing a shallow trench mask etch on each of the four semiconductor devices;

FIG. 12 illustrates the result of performing an implantation procedure for forming channel stops in the shallow trench areas of the PNP device and of the NMOS device. The NPN device and the PMOS device are covered with a mask layer;

FIG. 25 illustrates the deposition of a protective layer of polysilicon over the four semiconductor devices;

FIG. 26 illustrates the application of a procedure for etching the protective polysilicon layer from the NPN device and from the PNP device. The protective polysilicon layer on the NMOS device and on the PMOS device is covered with a mask layer;

FIG. 27 illustrates the deposition of a first layer of polysilicon (Poly1) over the four semiconductor devices;

FIG. 28 illustrates an implantation procedure for doping a portion of the Poly1 layer of the PNP device to form an extrinsic base in the PNP device and a portion of the Poly1 layer is of the NMOS device to form an NMOS gate. The NPN device and the PMOS device are covered with a mask layer;

FIG. 32 illustrates the result of performing a mask and etch procedure to etch portions of the Inter Poly Dielectric (IPD) layer and portions of the Poly1 layer over the NMOS device and over the PMOS device. The NPN device and the PNP device that were previously etched are covered with a mask layer;

FIG. 34 illustrates an implantation procedure for doping an intrinsic base of the NPN device and for doping a Lightly Doped Drain (LDD) of the PMOS device. The PNP device and the NMOS device are covered with a mask layer;

FIG. 35 illustrates an implantation procedure for doping an intrinsic base of the PNP device and for doping a Lightly Doped Drain (LDD) of the NMOS device. The NPN device and the PMOS device that were previously doped are covered with a mask layer;

FIG. 38 illustrates the deposition of a second layer of polysilicon (Poly2) over the four semiconductor devices;

FIG. 39 illustrates an implantation procedure for doping a portion of the Poly2 layer to form an emitter and a deep collector of the NPN device and for doping a portion of the Poly2 layer to form an NMOS source/drain in the NMOS device and for doping a portion of the Poly2 layer to form a well contact of the PMOS device. The PNP device is covered with a mask layer;

FIG. 42 illustrates the result of performing an etch procedure to etch portions of the Inter Poly Dielectric (IPD) layer and portions of the trench fill material on each of the four semiconductor devices;

FIG. 45 illustrates the formation of a layer of cobalt silicide to cover all Poly2 layers and all Poly1 layers that are not under a Poly2 layer;

FIG. 46 illustrates the deposition of a layer of tetra ethyl ortho silicate (TEOS) over the four semiconductor devices;

DETAILED DESCRIPTION OF THE INVENTION

FIGS. 1 through 50, discussed below, and the various embodiments used to describe the principles of the present invention in this patent document are by way of illustration only and should not be construed in any way to limit the scope of the invention. Persons who are skilled in the art will understand that the principles of the present invention may be implemented in any type of suitably arranged semiconductor device.

Figure 1:
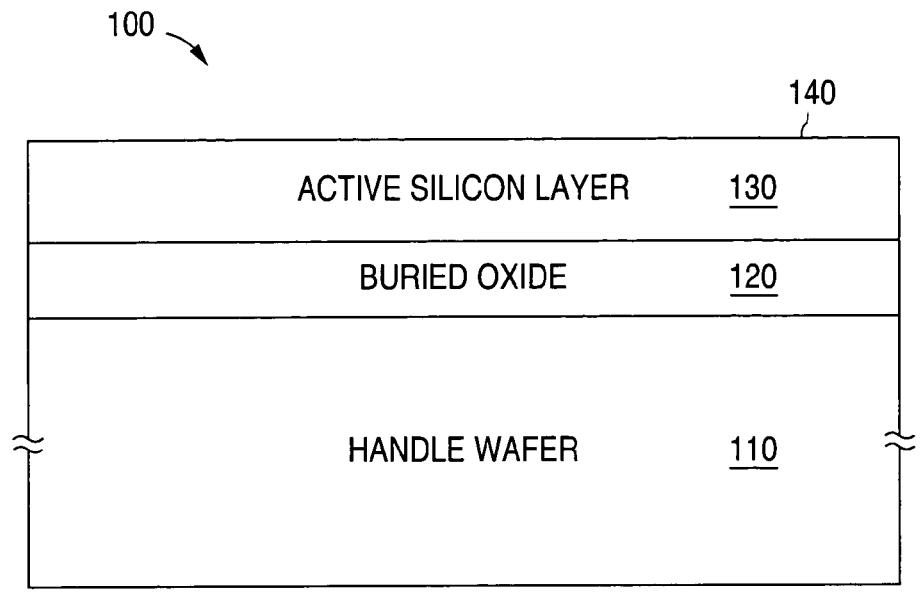
FIG. 1 illustrates a substrate comprising an active silicon layer on a buried oxide layer on a handle wafer for use in manufacturing a semiconductor device according to the principles of the present invention.
Figure 2A:
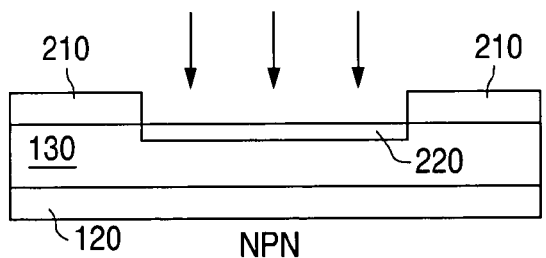
FIG. 2 illustrates four portions of the substrate shown in FIG. 1 in which an NPN semiconductor device, and a PNP semiconductor device, and an NMOS semiconductor device, and a PMOS semiconductor device will be manufactured in accordance with the principles of the present invention.
Figure 2B:
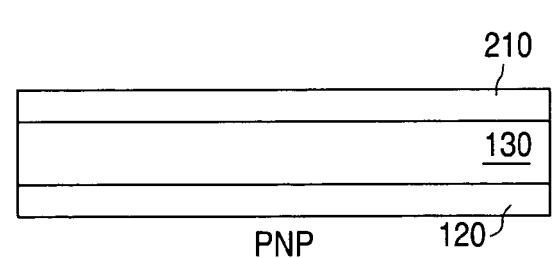
Figure 2C:
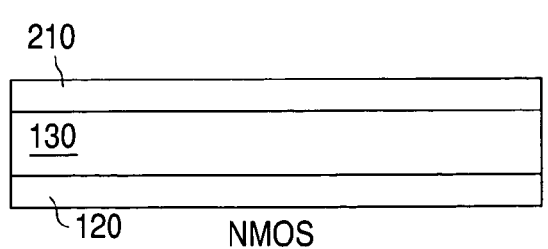
Figure 2D:
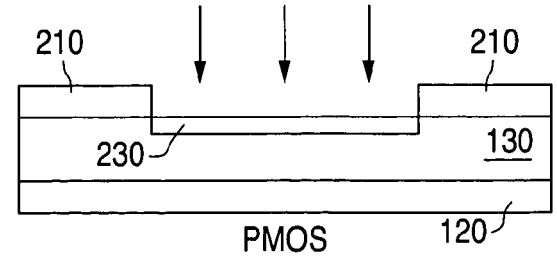
Figure 3A:
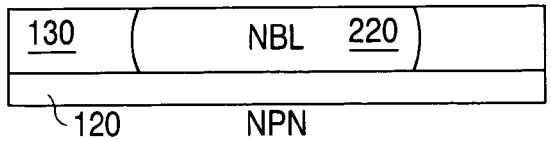
FIG. 3 illustrates the location of the NPN buried layer (NBL) in the NPN device and in the PMOS device.
Figure 3B:
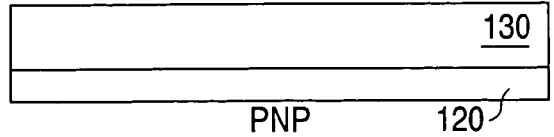
Figure 3C:
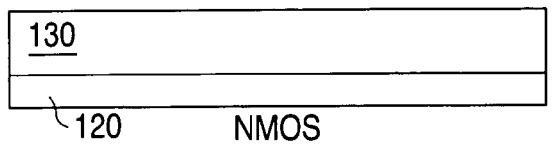
Figure 3D:
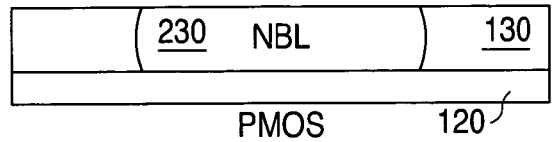
Figure 4A:
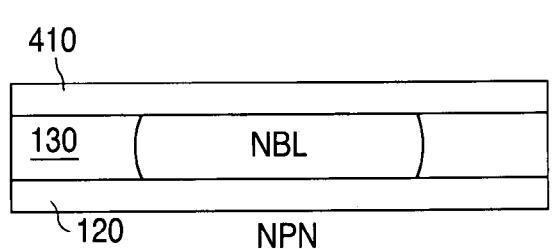
FIG. 4 illustrates an implant procedure for forming an PNP buried layer (PBL) in the PNP device and in the NMOS device.
Figure 4B:
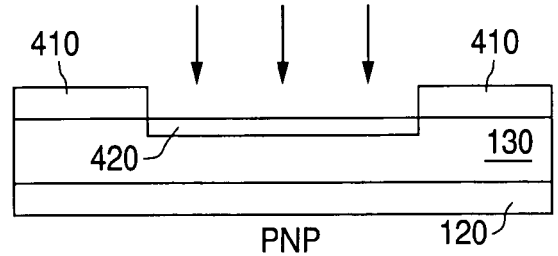
Figure 4C:
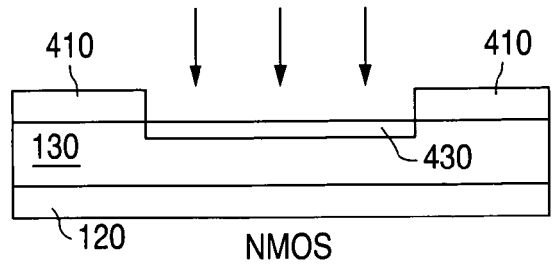
Figure 4D:
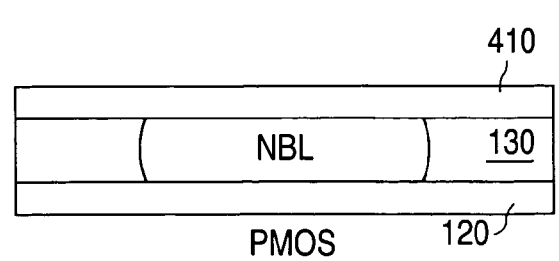
Figure 5A:
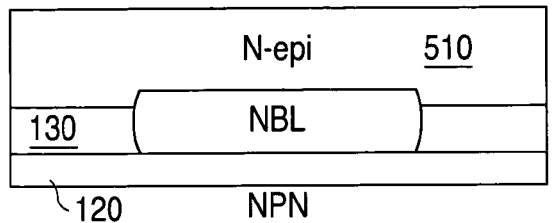
FIG. 5 illustrates the location of the PNP buried layer (PBL) in the PNP device and in the NMOS device and an N-epi layer grown over all four semiconductor devices.
Figure 5B:
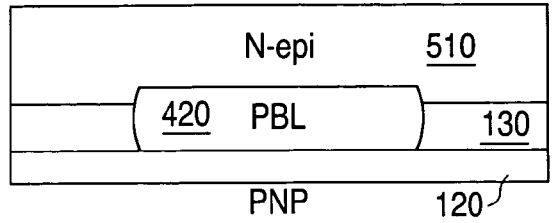
Figure 5C:
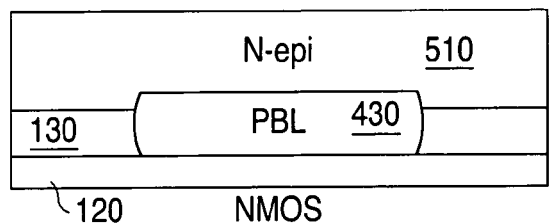
Figure 5D:
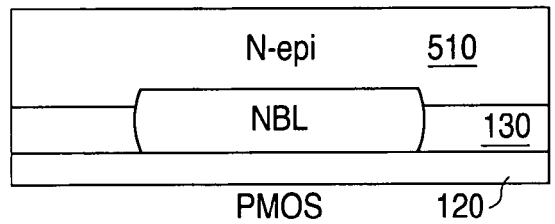
Figure 6A:
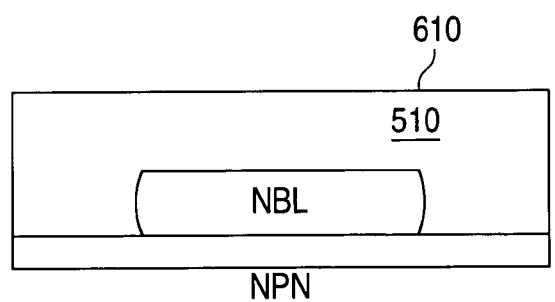
FIG. 6 illustrates the location of a layer of Epi oxide grown over all four semiconductor devices.
Figure 6B:
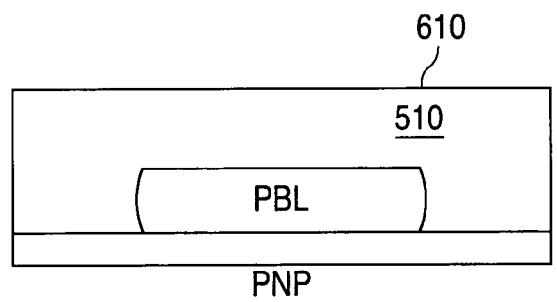
Figure 6C:
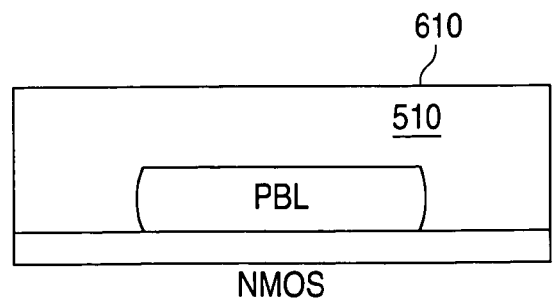
Figure 6D:
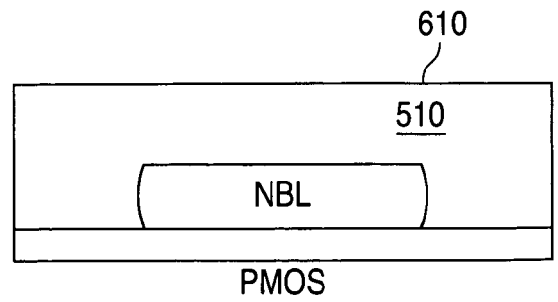
Figure 7A:
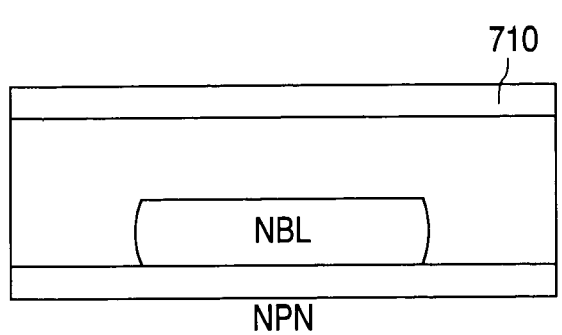
FIG. 7 illustrates an implant procedure for forming a P well in the PNP device.
Figure 7B:
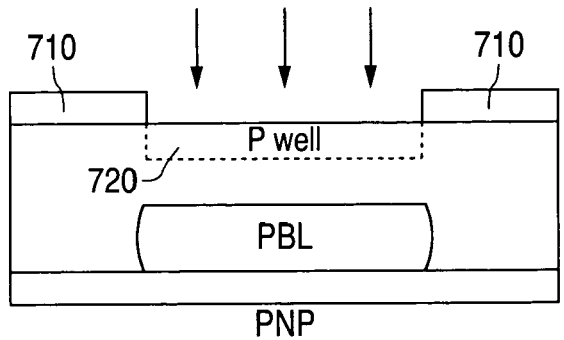
Figure 7C:
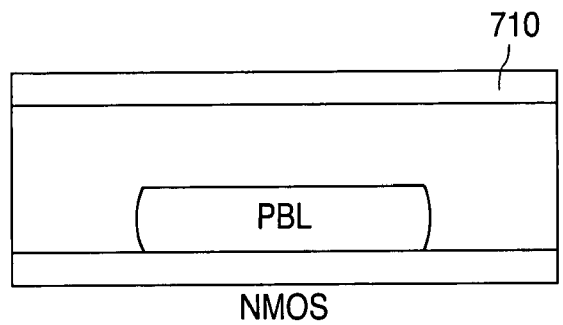
Figure 7D:
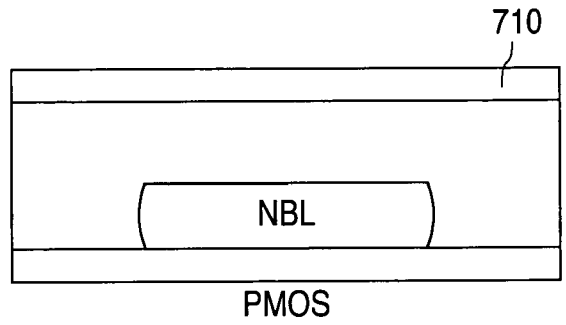
Figure 8A:
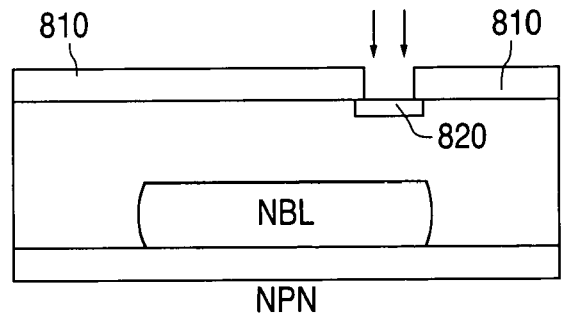
FIG. 8 illustrates the location of the P well in the PNP device and an implant procedure for forming an N+ sinker in the NPN device and in the PMOS device.
Figure 8B:
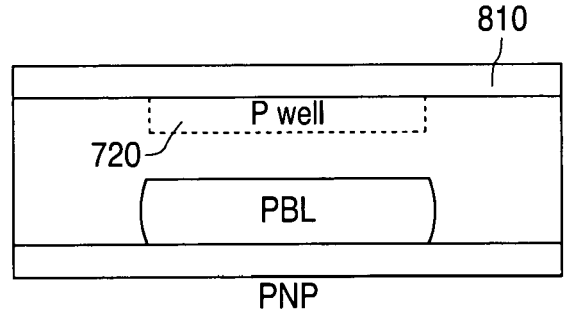
Figure 8C:
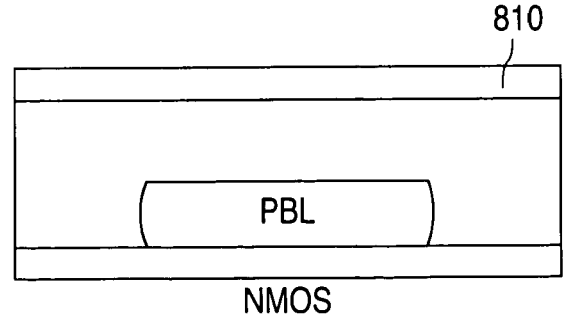
Figure 8D:
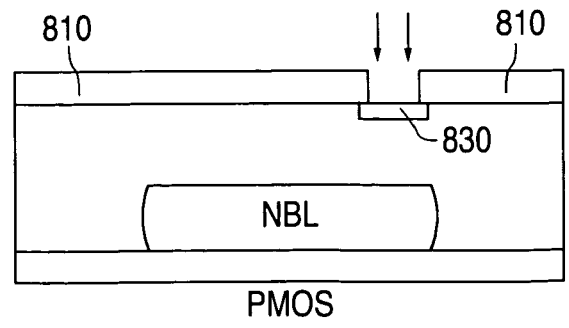
Figure 9A:
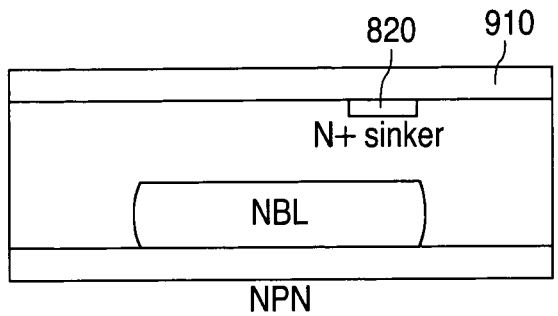
FIG. 9 illustrates the location of the N+ sinker in the NPN device and in the PMOS device and an implant procedure for forming an P+ sinker in the PNP device and in the NMOS device.
Figure 9B:
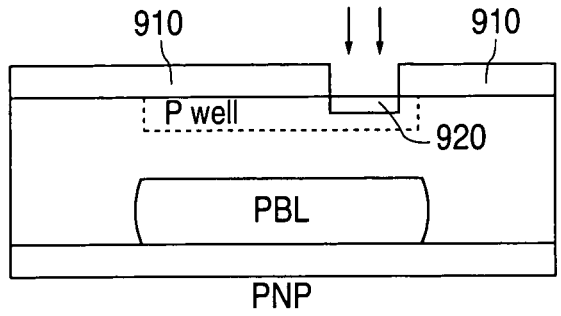
Figure 9C:
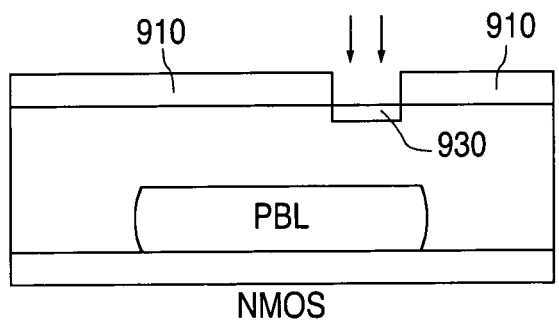
Figure 9D:
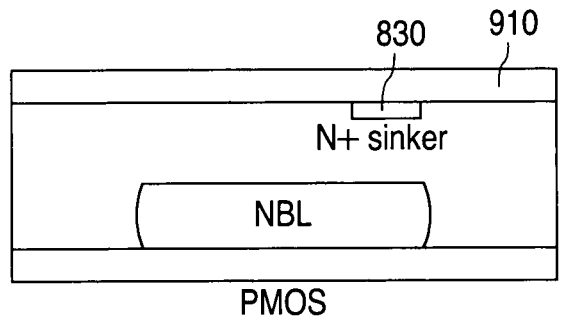
Figure 10A:
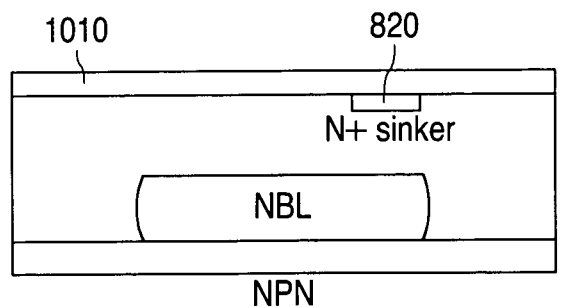
FIG. 10 illustrates the location of the P+ sinker in the PNP device and in the NMOS device and the deposition of a nitride layer over the layer of Epi oxide on all four semiconductor devices.
Figure 10B:
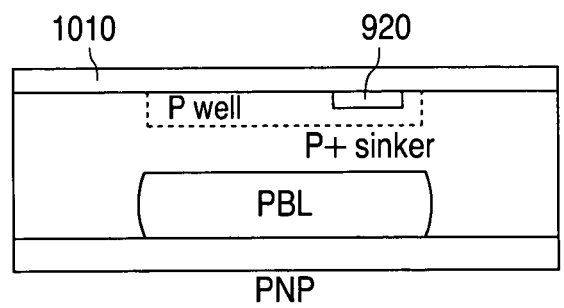
Figure 10C:
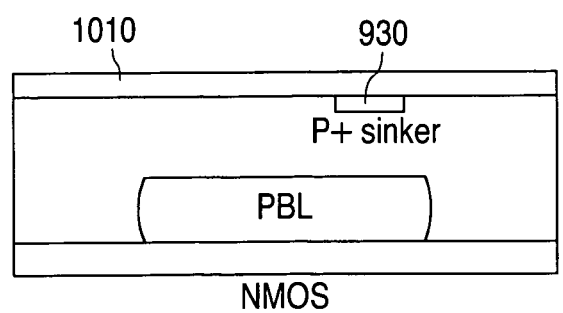
Figure 10D:
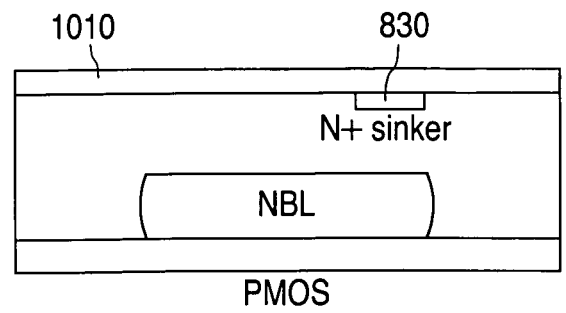
Figure 13A:
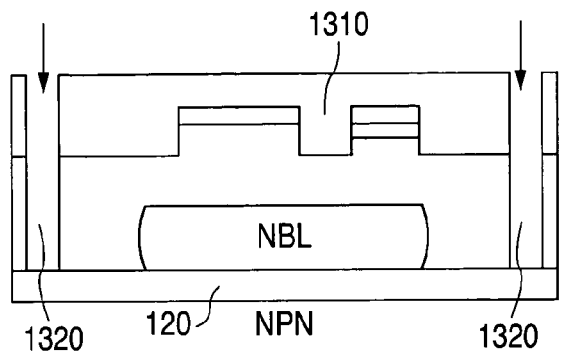
FIG. 13 illustrates the result of a mask and etch procedure for forming deep trenches to isolate each of the four semiconductor devices.
Figure 13B:
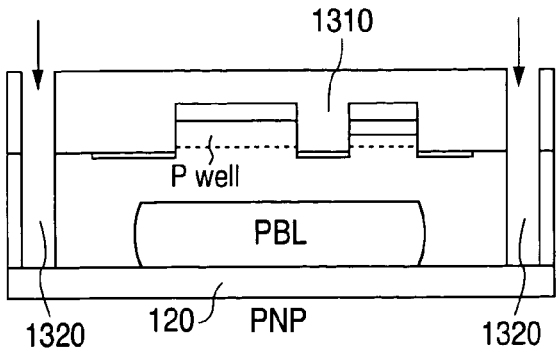
Figure 13C:
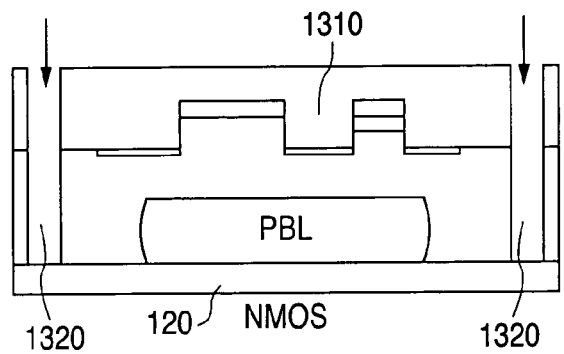
Figure 13D:
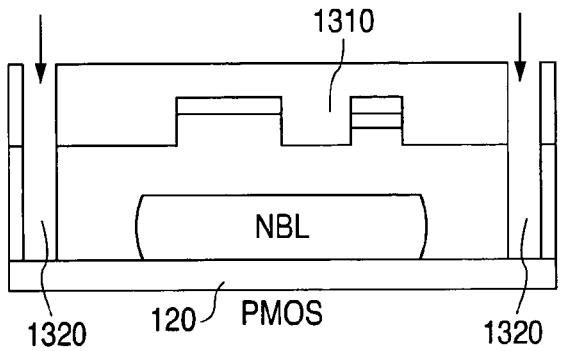
Figure 14A:
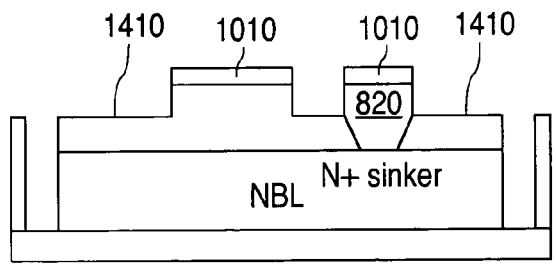
FIG. 14 illustrates the deposition of a trench liner oxidation layer on the four semiconductor devices.
Figure 14B:
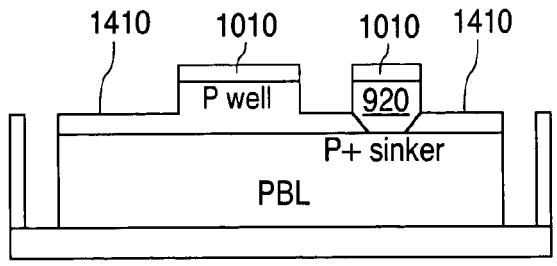
Figure 14C:
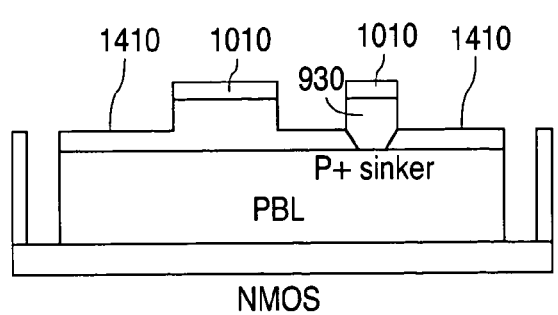
Figure 14D:
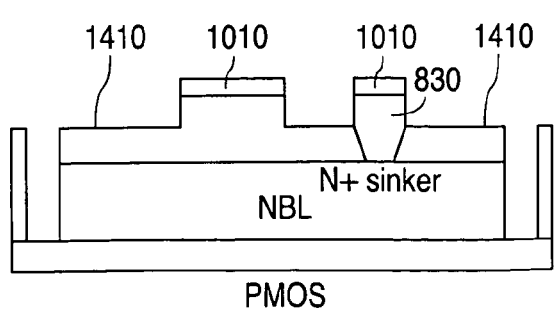
Figure 15A:
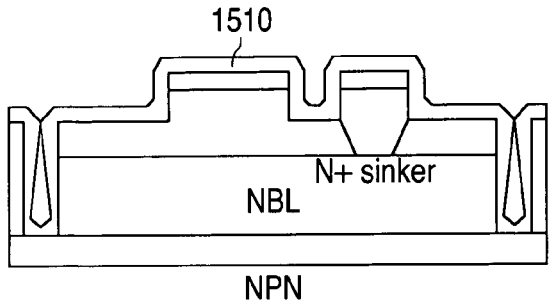
FIG. 15 illustrates the deposition of a trench fill oxide base layer over the four semiconductor devices.
Figure 15B:
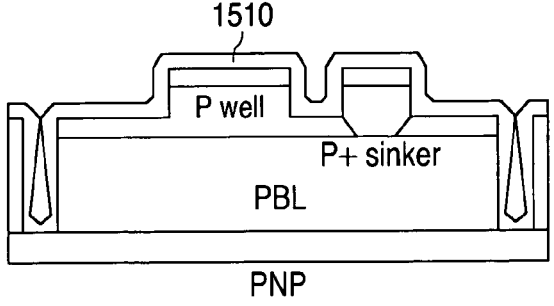
Figure 15C:
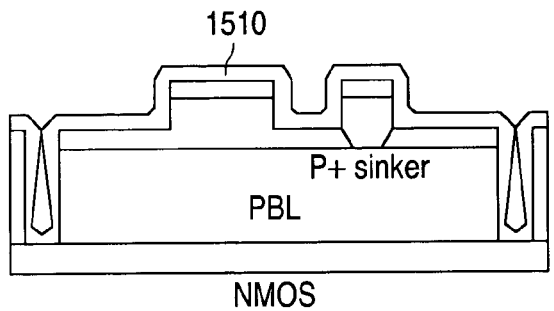
Figure 15D:
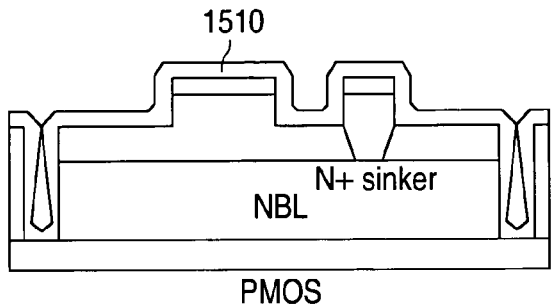
Figure 16A:
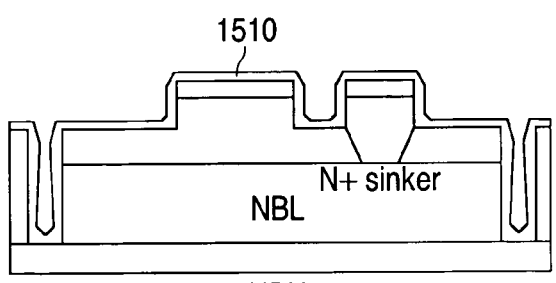
FIG. 16 illustrates the result of performing an etch back of the trench fill oxide base layer over the four semiconductor devices.
Figure 16B:
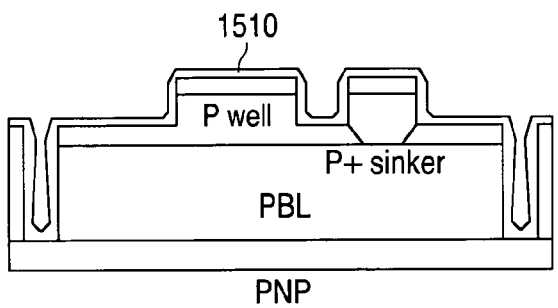
Figure 16C:
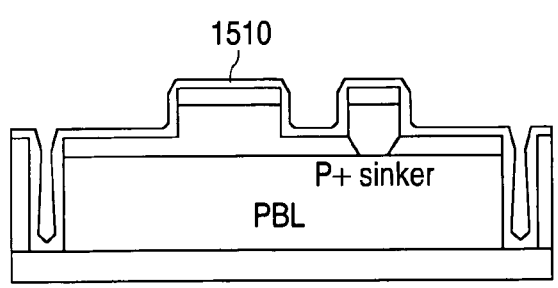
Figure 16D:
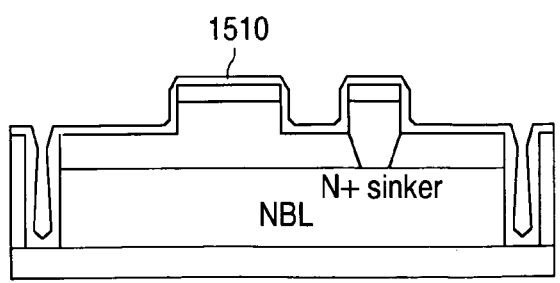
Figure 17A:
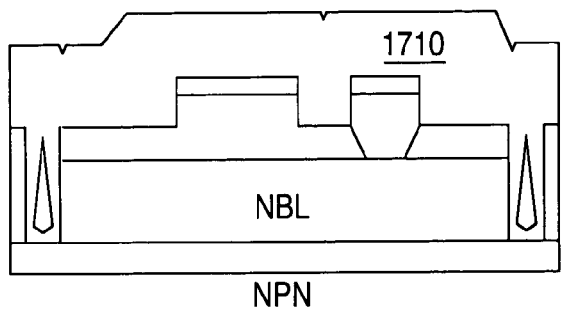
FIG. 17 illustrates the application of a trench fill oxidation layer over the four semiconductor devices.
Figure 17B:
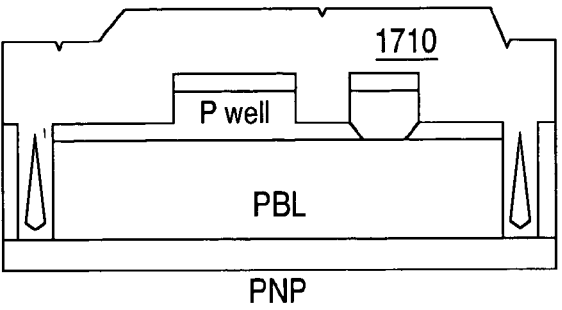
Figure 17C:
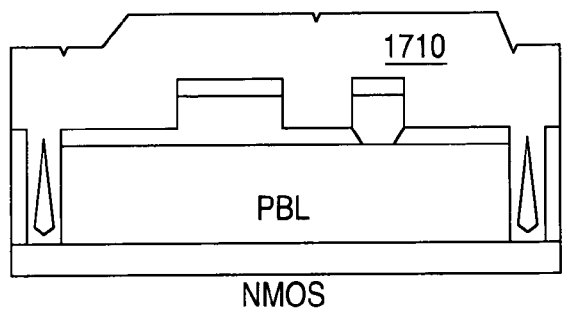
Figure 17D:
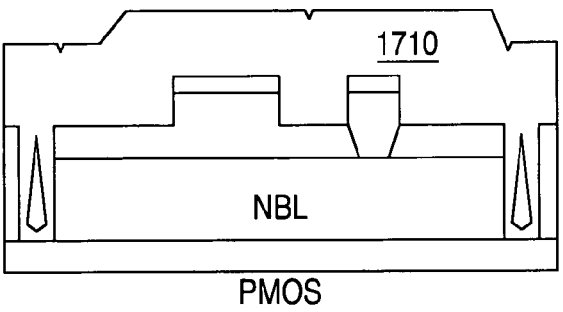
Figure 18A:
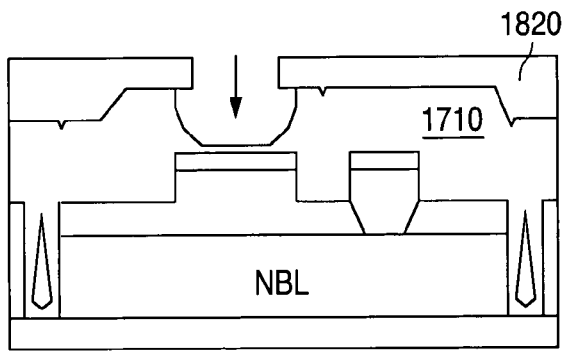
FIG. 18 illustrates the application of a reverse trench mask and a partial wet etch procedure over the four semiconductor devices.
Figure 18B:
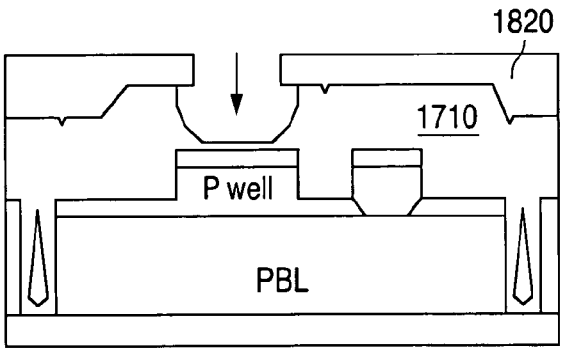
Figure 18C:
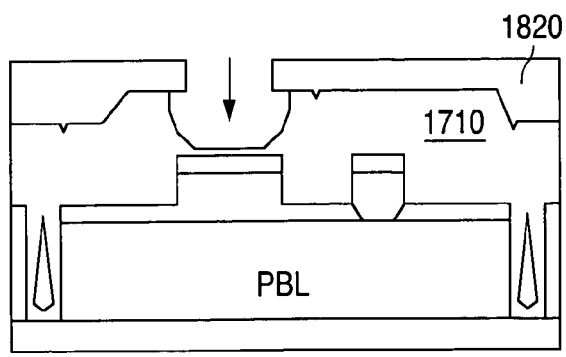
Figure 18D:
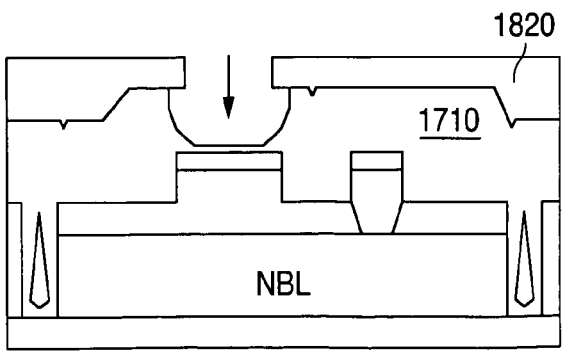
Figure 19A:
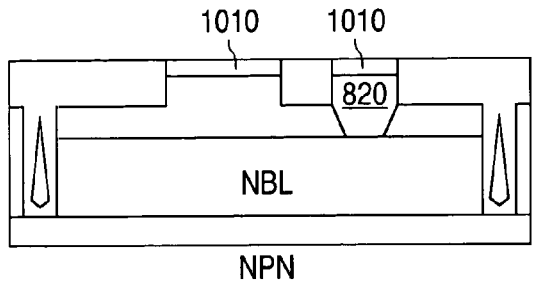
FIG. 19 illustrates the application of a chemical mechanical polishing (CMP) procedure over the four semiconductor devices.
Figure 19B:
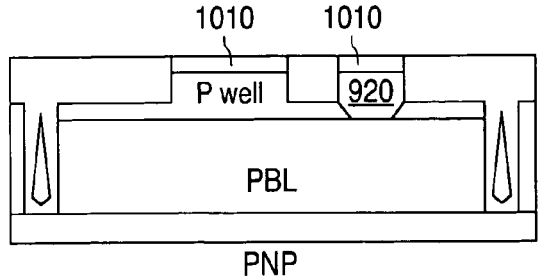
Figure 19C:
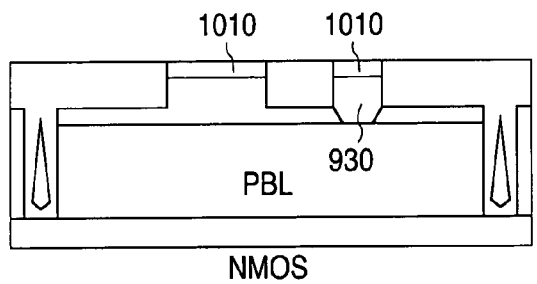
Figure 19D:
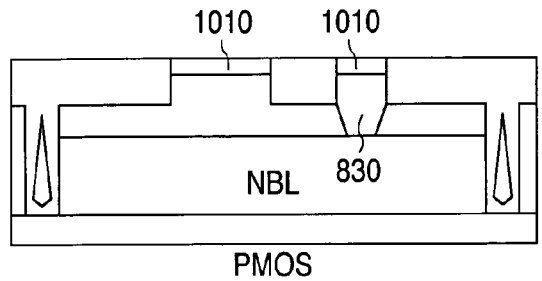
Figure 20A:
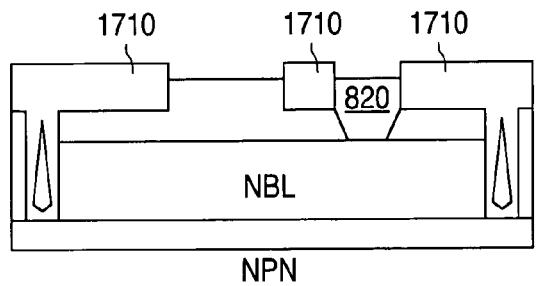
FIG. 20 illustrates the application of a nitride and oxide wet strip procedure over the four semiconductor devices.
Figure 20B:
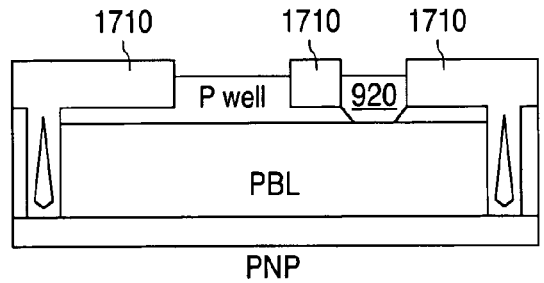
Figure 20C:
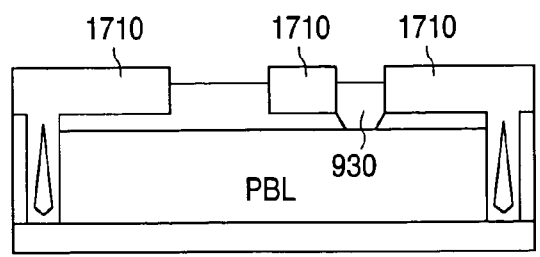
Figure 20D:
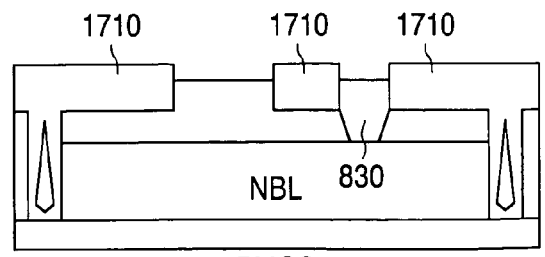
Figure 21A:
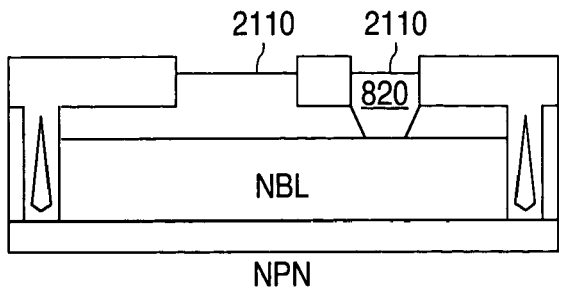
FIG. 21 illustrates the application of a sacrificial oxide layer over the four semiconductor devices.
Figure 21B:
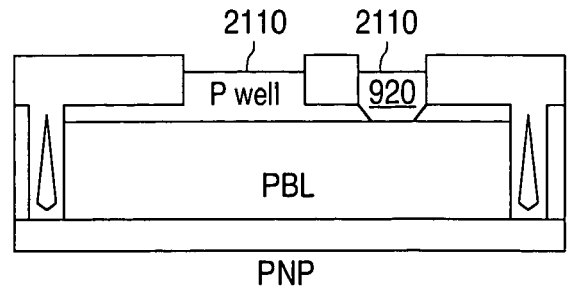
Figure 21C:
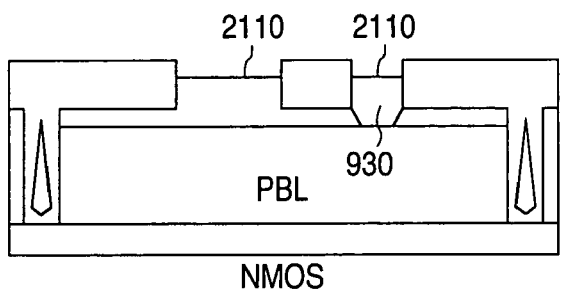
Figure 21D:
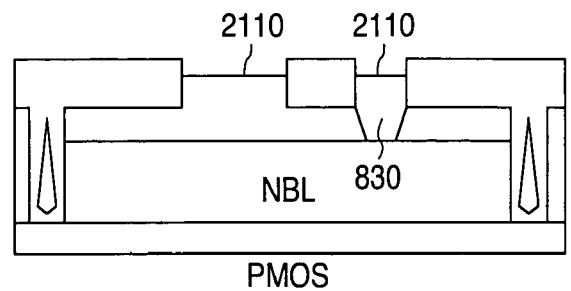
Figure 22A:
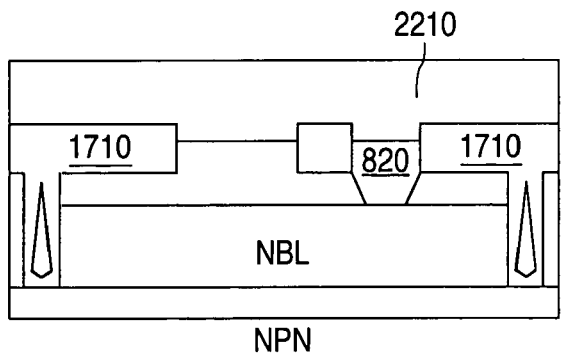
FIG. 22 illustrates the application of a procedure for implanting a CMOS N Well in the PMOS device.
Figure 22B:
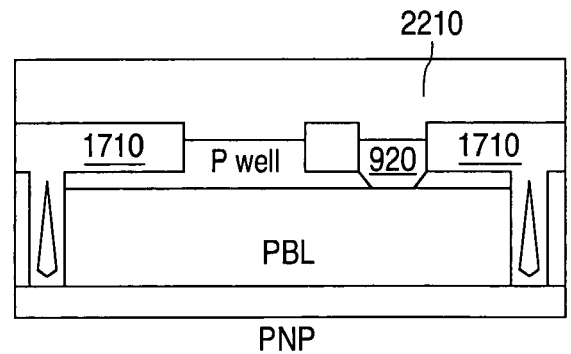
Figure 22C:
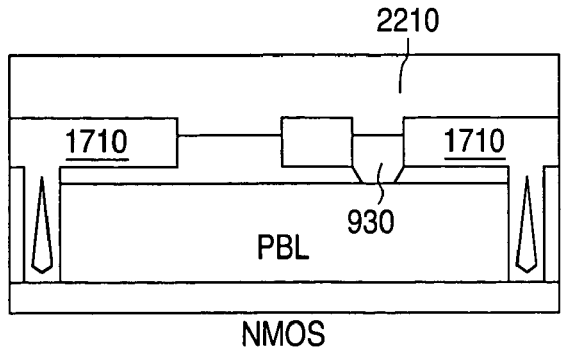
Figure 22D:
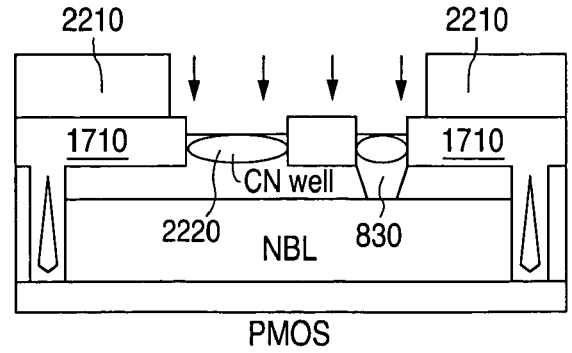
Figure 23A:
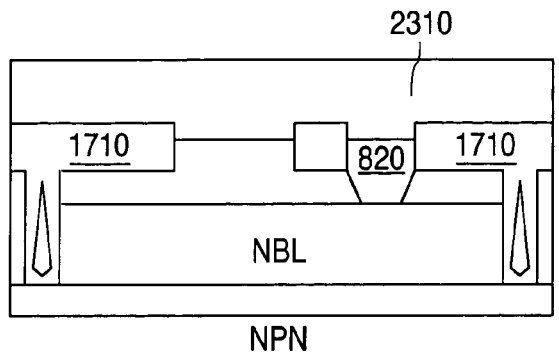
FIG. 23 illustrates the application of a procedure for implanting a CMOS P Well in the NMOS device.
Figure 23B:
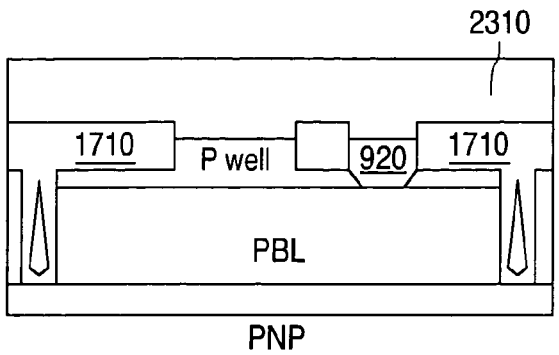
Figure 23C:
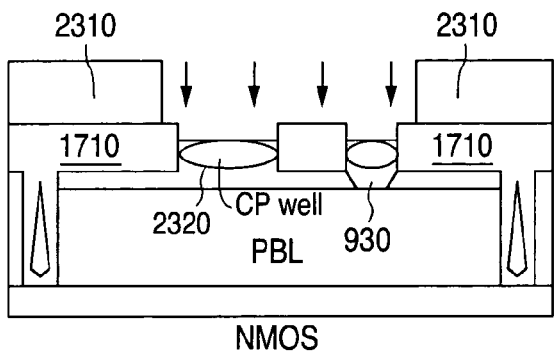
Figure 23D:
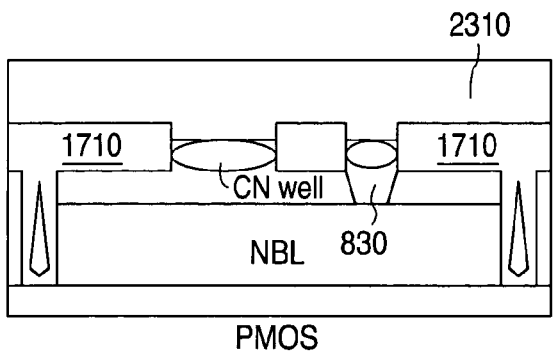
Figure 24A:
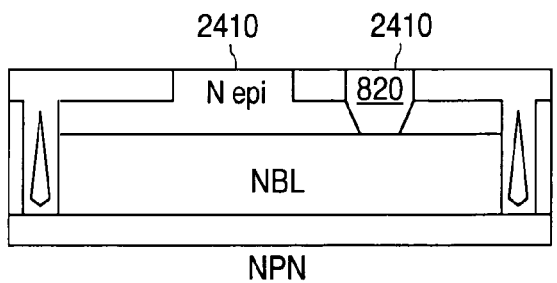
FIG. 24 illustrates the application of a pre-gate plasma etch procedure and the growth of a gate oxide layer over the four semiconductor devices.
Figure 24B:
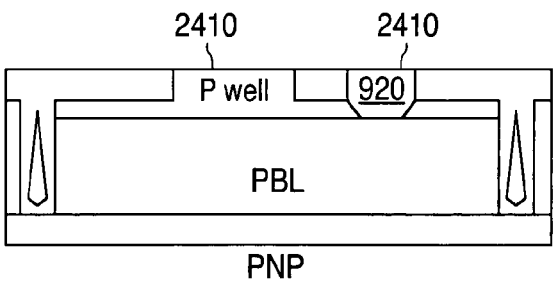
Figure 24C:
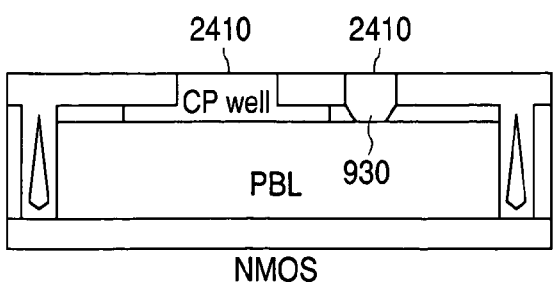
Figure 24D:
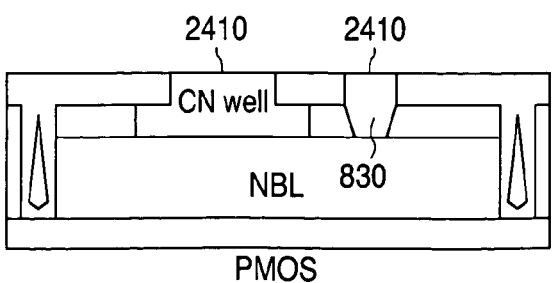
Figure 29A:
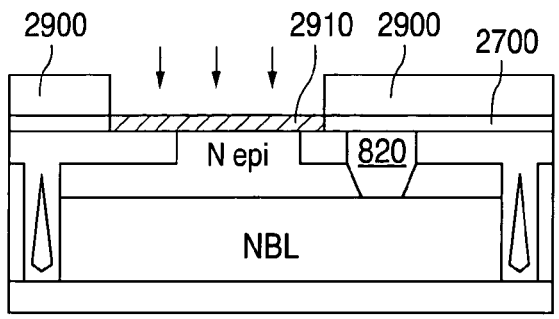
FIG. 29 illustrates an implantation procedure for doping a portion of the Poly1 layer of the NPN device to form an extrinsic base in the NPN device and a portion of the Poly1 layer of the PMOS device to form a PMOS gate. The PNP device and the NMOS device are covered with a mask layer.
Figure 29B:
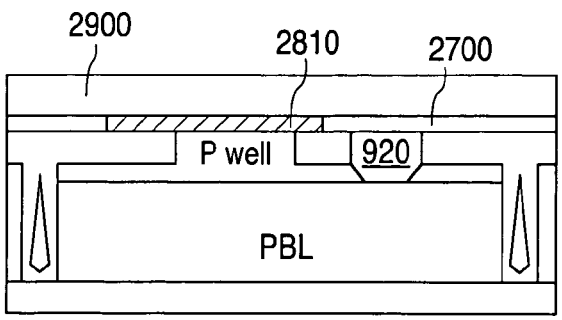
Figure 29C:
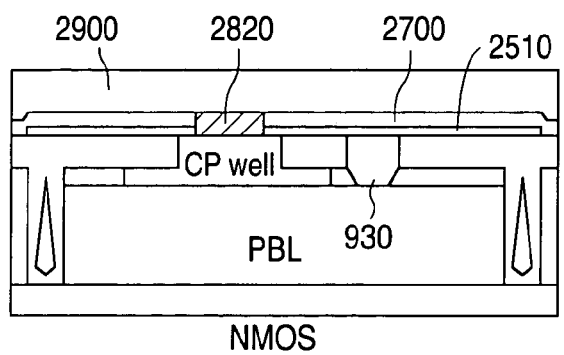
Figure 29D:
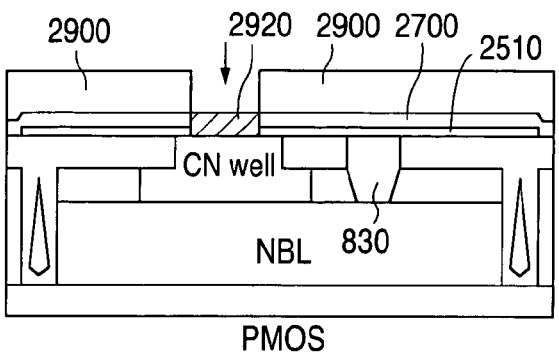
Figure 30A:
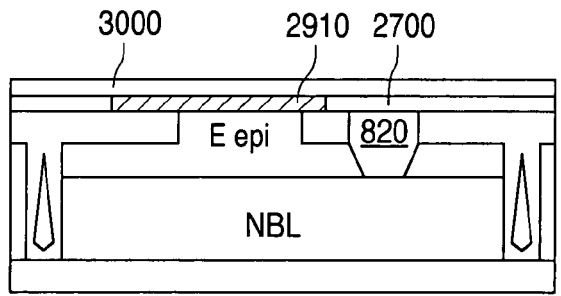
FIG. 30 illustrates the deposition of a layer of an Inter Poly Dielectric (IPD) over the four semiconductor devices.
Figure 30B:
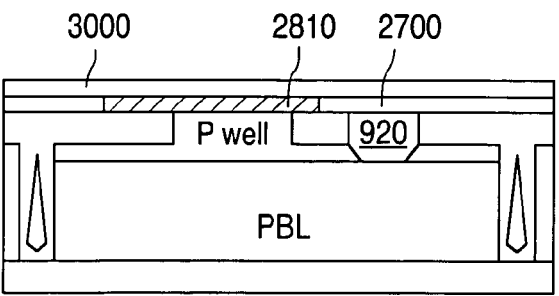
Figure 30C:
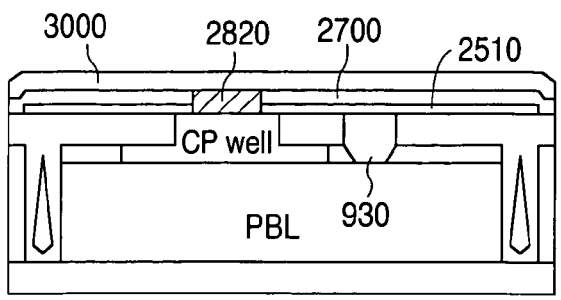
Figure 30D:
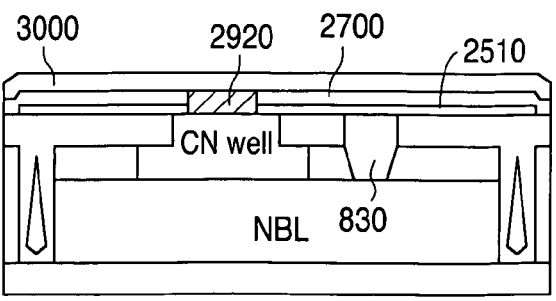
Figure 31A:
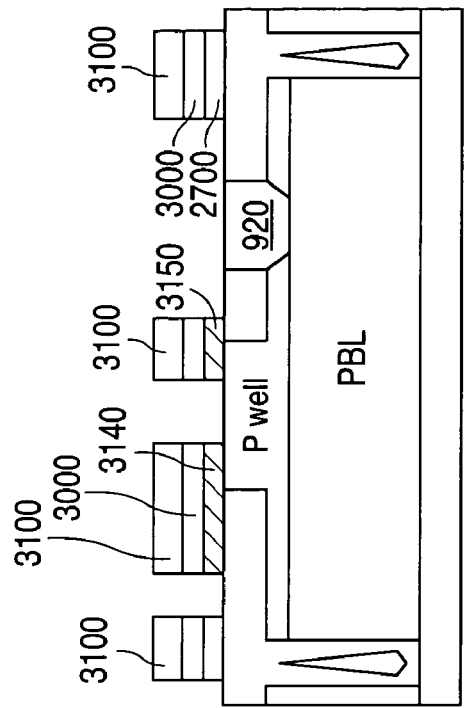
FIG. 31 illustrates the result of performing a mask and etch procedure to etch portions of the Inter Poly Dielectric (IPD) layer and portions of the Poly1 layer over the NPN device and over the PNP device. The NMOS device and the PMOS device are covered with a mask layer.
Figure 31B:
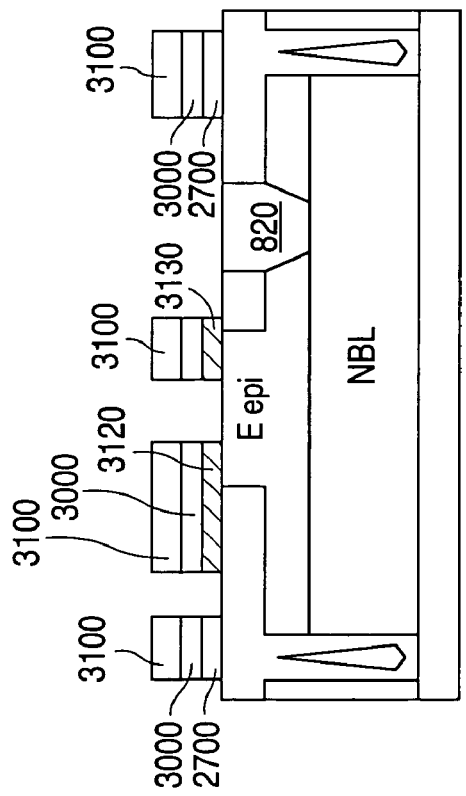
Figure 31C:
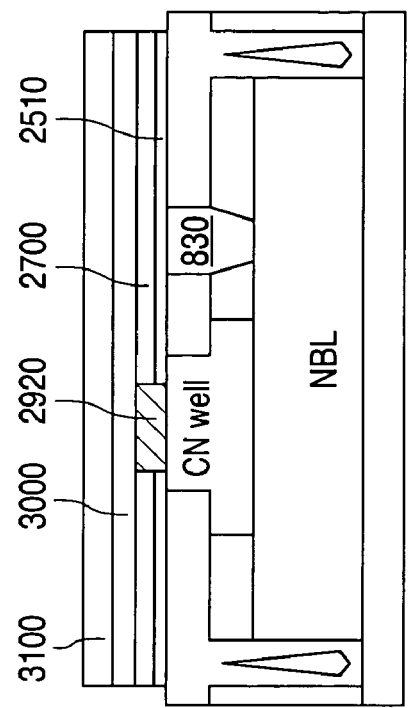
Figure 31D:
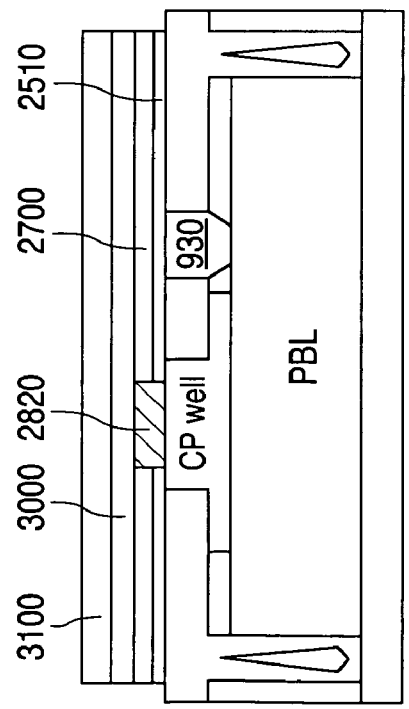
Figure 33B:
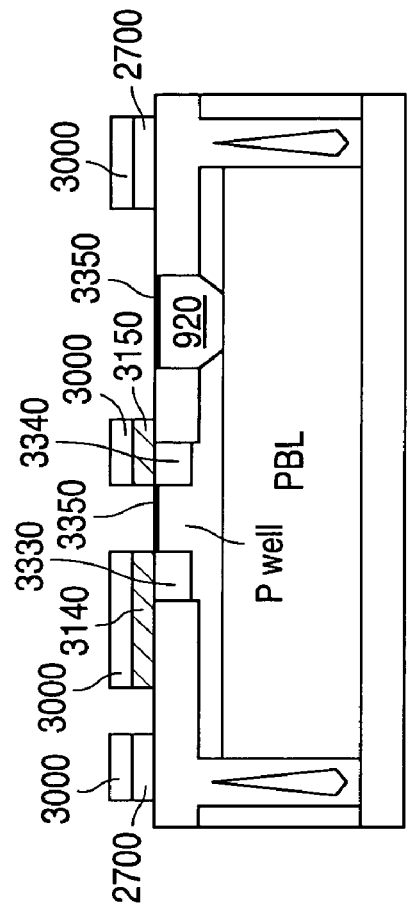
FIG. 33 illustrates the result of a diffusion and oxidation procedure in which dopant from the extrinsic base diffuses into the diffused extrinsic base areas of the NPN device and the PNP device.
Figure 33D:
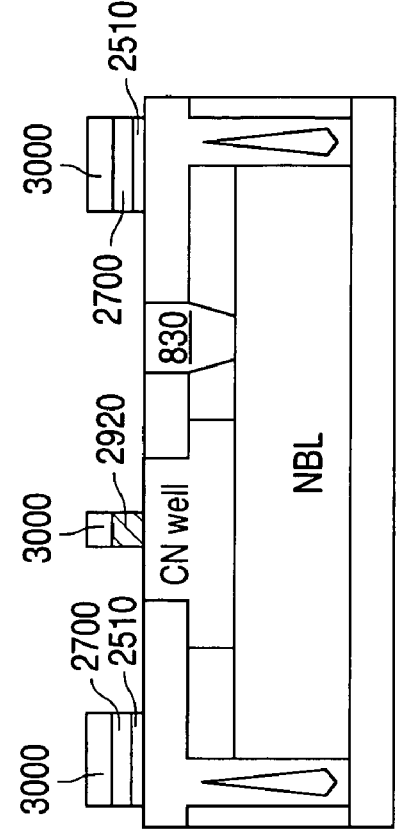
Figure 33A:
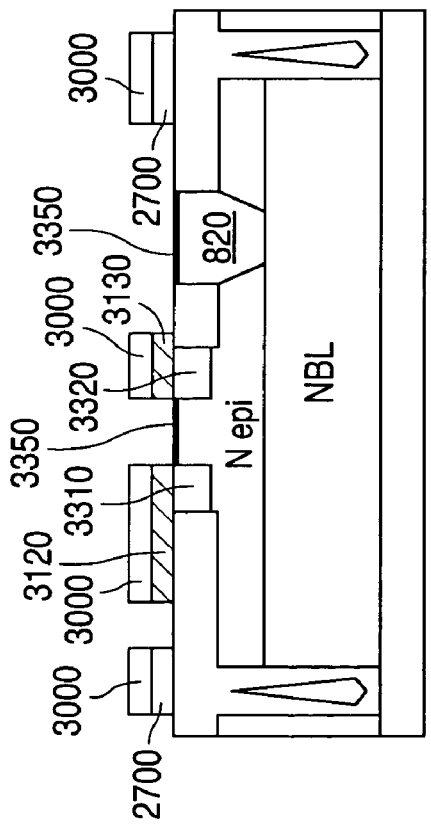
Figure 33C:
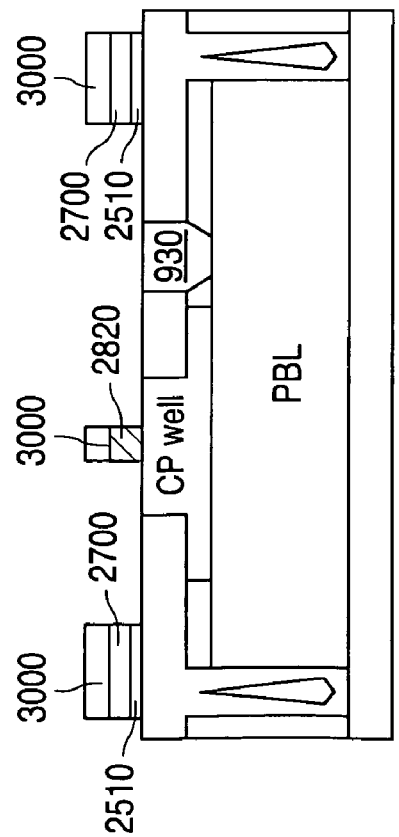
Figure 36A:
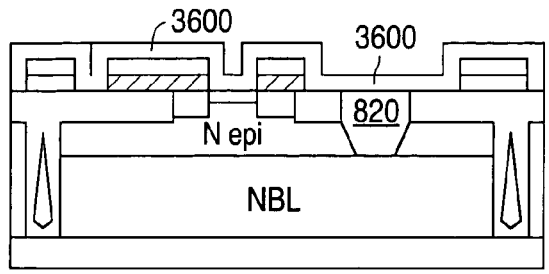
FIG. 36 illustrates the deposition of a nitride spacer layer over the four semiconductor devices.
Figure 36B:
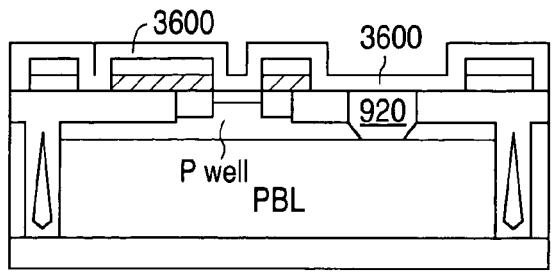
Figure 36C:
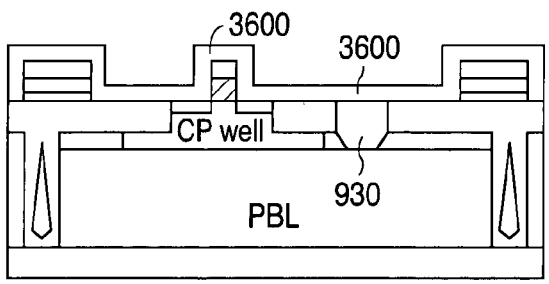
Figure 36D:
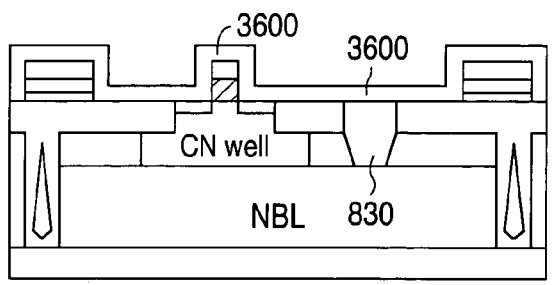
Figure 37A:
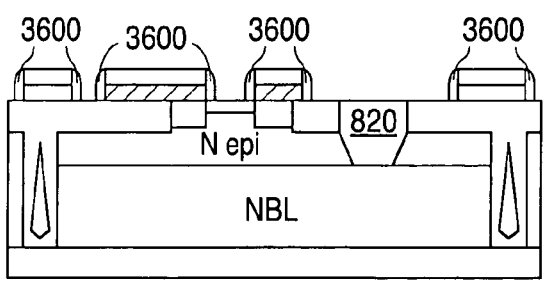
FIG. 37 illustrates the result of an etch back procedure applied to the nitride spacer layer.
Figure 37B:
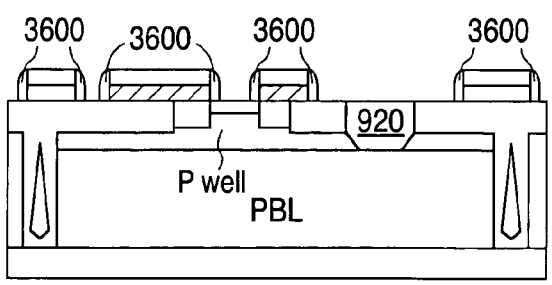
Figure 37C:
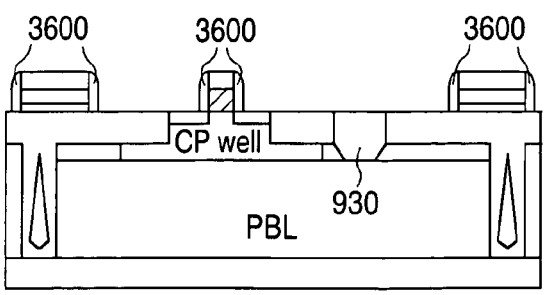
Figure 37D:
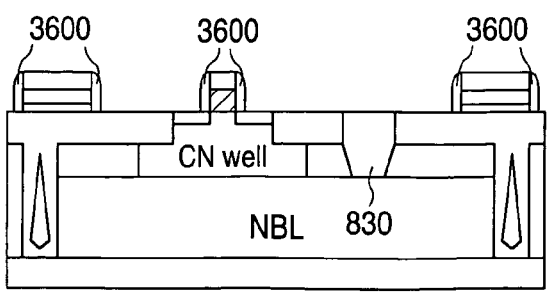
Figure 40A:
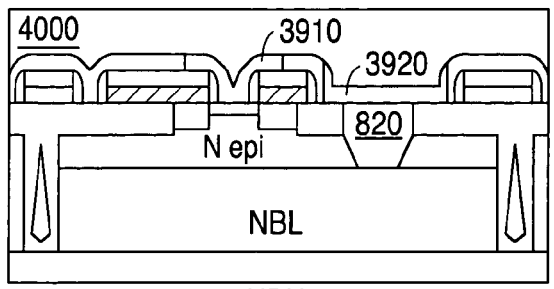
FIG. 40 illustrates an implantation procedure for doping a portion of the Poly2 layer to form an emitter and a deep collector of the PNP device and for doping a portion of the Poly2 layer to form a well contact of the NMOS device and for doping a portion of the Poly2 layer to form a PMOS source/drain of the PMOS device. The NPN device that was previously doped is covered with a mask layer.
Figure 40B:
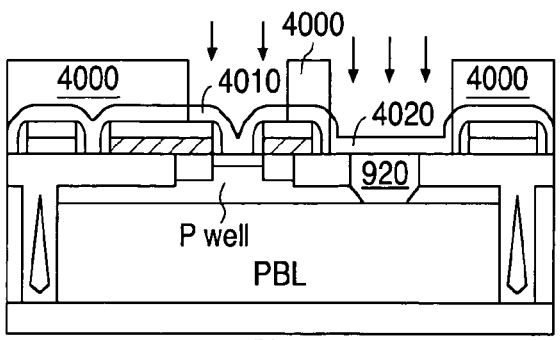
Figure 40C:
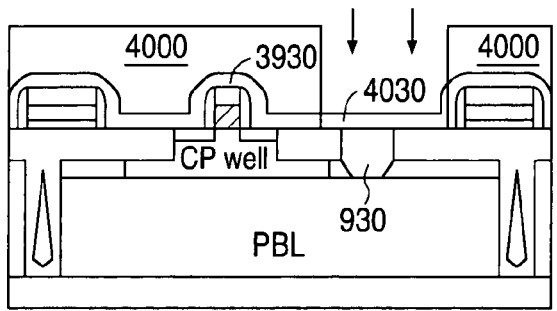
Figure 40D:
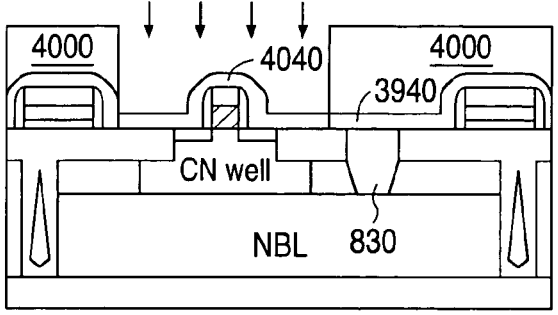
Figure 41A:
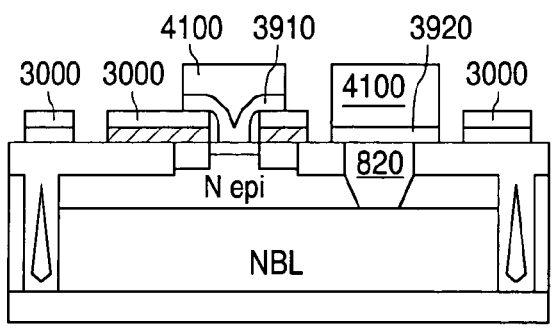
FIG. 41 illustrates the result of performing a mask and etch procedure to etch portions of the Poly2 layer to define the emitters and collectors of the NPN device and of the PNP device and to define the sources and drains of the NMOS device and of the PMOS device.
Figure 41B:
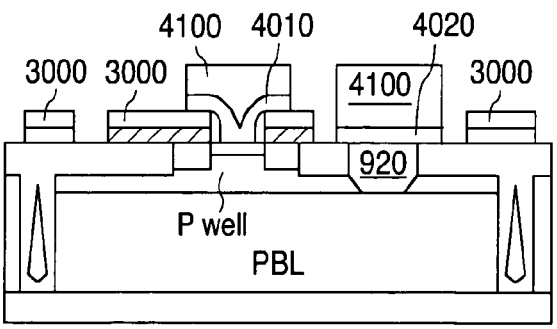
Figure 41C:
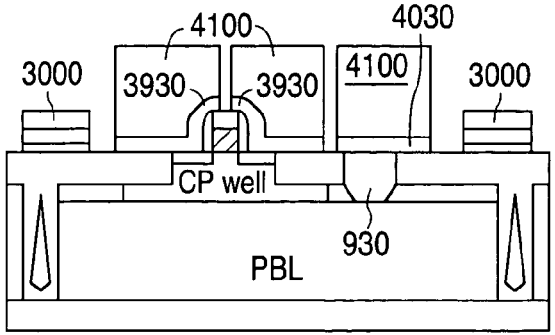
Figure 41D:
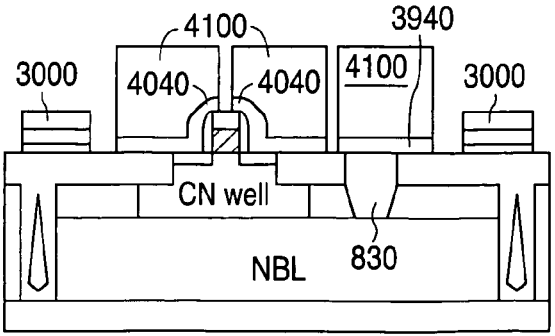
Figure 43A:
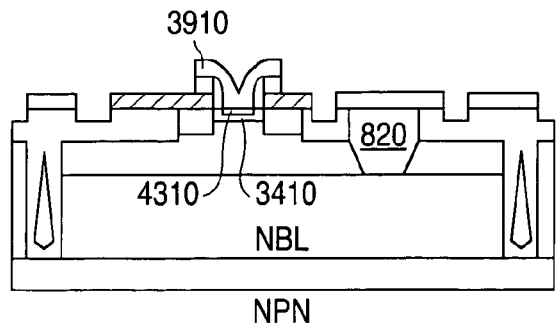
FIG. 43 illustrates the result of applying a Rapid Thermal Process (RTP) to activate the emitters in the NPN device and in the PNP device and to activate the sources and drains in the NMOS device and in the PMOS device.
Figure 43B:
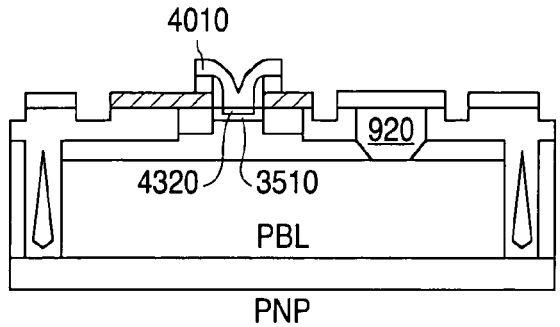
Figure 43C:
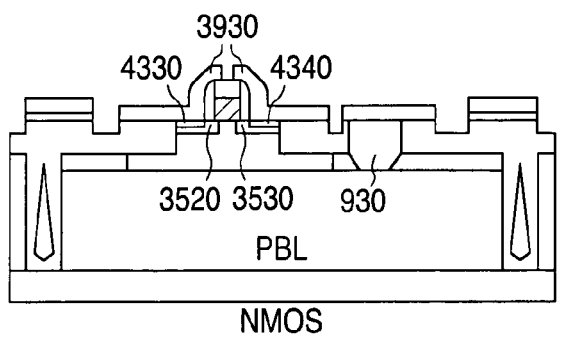
Figure 43D:
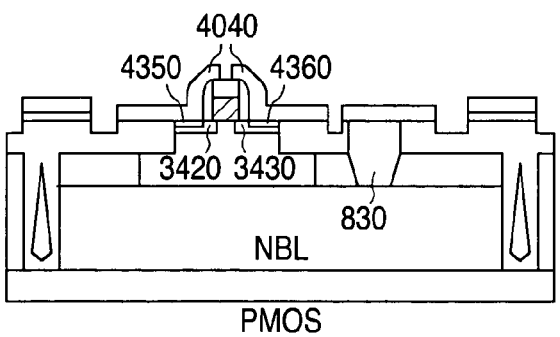

FIG. 1 illustrates a substrate 100 for use in manufacturing a semiconductor device according to the principles of the present invention. The foundation of substrate 100 comprises a handle wafer 110 on which a buried oxide layer 120 is formed. An active silicon layer 130 is formed on the buried oxide layer 120. In an advantageous embodiment of the invention the thickness of the active silicon layer 130 is approximately two and two tenths microns (2.2μ) and the thickness of the buried oxide layer 120 is approximately one micron (1.0μ). The buried oxide layer 120 insulates the handle wafer 110 from the active silicon layer 130 to eliminate leakage and reduce capacitance. The handle wafer 110 will be shown only in FIG. 1.

Persons who are skilled in the art will recognize that substrate 100 shown in FIG. 1 is part of a silicon on insulator (SOI) isolation architecture. The semiconductor devices that will be more fully described in this patent document can also be isolated by other types of isolation architectures such as (1) junction isolation, (2) deep and/or shallow trenches filled with oxide and/or polysilicon, and (3) local oxidation of silicon. This list of alternative isolation architectures is not exhaustive and other types of isolation architectures may also be used.

A layer of screen oxide 140 is then applied to the surface of the active silicon layer 130. In an advantageous embodiment of the invention the thickness of the screen oxide 140 is approximately two hundred fifty Ångstroms (250 Å) or twenty five thousandths of a micron (0.025 Å).

FIG. 2 illustrates four portions of the substrate shown in FIG. 1. The steps of the manufacturing method of the present invention will be described for an NPN bipolar transistor semiconductor device, and a PNP bipolar transistor semiconductor is device, and an NMOS transistor semiconductor device, and a PMOS transistor semiconductor device. Although the four semiconductor devices are shown separately in FIG. 2, the four semiconductor devices are all located on and manufactured from the same substrate 100.

FIG. 2 illustrates an implant procedure for forming an NPN buried layer (NBL) 220 in the NPN device and an NPN buried layer (NBL) 230 in the PMOS device. A photoresist mask 210 is placed over the four devices and openings are etched through the photoresist mask 210 over the NPN device and the PMOS device. The arrows in FIG. 2 illustrate the implant doping procedure for forming the NPN buried layers. FIG. 3 illustrates the location of NPN buried layer (NBL) 220 in the NPN device and the location of NPN buried layer (NBL) 230 in the PMOS device.

FIG. 4 illustrates an implant procedure for forming a PNP buried layer (PBL) 420 in the PNP device and a PNP buried layer (PBL) 430 in the NMOS device. A photoresist mask 410 is placed over the four devices and openings are etched through the photoresist mask 410 over the PNP device and over the NMOS device. The arrows in FIG. 4 illustrate the implant doping procedure for forming the PNP buried layers. FIG. 5 illustrates the location of PNP buried layer (PBL) 420 in the PNP device and the location of PNP buried layer (PBL) 430 in the NMOS device.

An N-epitaxial layer (N-epi) 510 is then grown over the four semiconductor devices (NPN, PNP, NMOS, PMOS). In an advantageous embodiment of the invention the thickness of the N-epi layer 510 is approximately two and one tenth microns (2.1μ). FIG. 5 illustrates the placement of the N-epi layer 510 over the four semiconductor devices.

Persons who are skilled in the art will recognize that a P-epitaxial layer (P-epi) (not shown) or an undoped epitaxial layer (not shown) could also be used as long as an appropriate doping was executed. Specifically, with a P-epi the PNP device would not need a P well, but the NPN device would need an N well. With an intrinsic epi both the PNP device and the NPN device would need an appropriate well. Alternatively, the NPN and PNP devices could be formed without epi, either by using a high energy implant process to form the buried layers or by forming the devices without buried layers.

A layer of epi oxide 610 is then applied to the surface of the N-epi layer 510 as shown in FIG. 6. In an advantageous embodiment of the invention the thickness of the epi oxide 610 is approximately two hundred fifty Ångstroms (250 Å) or twenty five thousandths of a micron (0.025μ). To simplify the drawings the reference numerals from previous drawings will generally not be repeated for structures that have already been identified.

In the next step of the manufacturing method of the invention a P well is formed in the PNP device. FIG. 7 illustrates an implant procedure for forming a P well in the PNP device. A photoresist mask 710 is placed over the four devices and openings are etched through the photoresist mask 710 over the PNP device. The arrows in FIG. 7 illustrate the implant doping procedure for forming the P well 720. FIG. 7 and FIG. 8 illustrate the location of the P well 720 in the PNP device.

In the next step of the manufacturing method of the invention an N+ sinker is formed in the NPN device and an N+ well contact is formed in the PMOS device. FIG. 8 illustrates an implant procedure for forming an N+ sinker 820 in the NPN device and an N+ well contact 830 in the PMOS device. A photoresist mask 810 is placed over the four devices and openings are etched through the photoresist mask 810 over the NPN device and over the PMOS device. The arrows in FIG. 8 illustrate the implant doping procedure for forming the N+ sinker 820 and the N+ well contact 830. FIG. 8 and FIG. 9 illustrate the location of N+ sinker 820 in the NPN device and the location of N+ well contact 830 in the PMOS device.

In the next step of the manufacturing method of the invention a P+ sinker is formed in the PNP device and a P+ well contact is formed in the NMOS device. FIG. 9 illustrates an implant procedure for forming a P+ sinker 920 in the PNP device and a P+ well contact 930 in the NMOS device. A photoresist mask 910 is placed over the four devices and openings are etched through the photoresist mask 910 over the PNP device and over the NMOS device. The arrows in FIG. 9 illustrate the implant doping procedure for forming the P+ sinker 920 and the P+ well contact 930. FIG. 9 and FIG. 10 illustrate the location of P+ sinker 920 in the PNP device and the location of P+ well contact 930 in the NMOS device.

Persons who are skilled in the art will recognize that the sinkers and buried layers described above are not essential to either the bipolar transistor devices or the MOS transistor devices. The sinkers and buried layers described above represent a best mode of the apparatus of the present invention.

In the next step of the manufacturing method of the invention the photoresist mask is removed and a layer of nitride 1010 is deposited on the surfaces of the four devices. In an advantageous embodiment of the invention the thickness of the nitride layer 1010 is approximately one thousand eight hundred fifty Ångstroms (1850 Å) or one hundred eighty five thousandths of a micron (0.185μ). FIG. 10 illustrates the location of the nitride layer 1010.

In the next step of the manufacturing method of the invention a shallow trench mask and etch procedure is performed. FIG. 11 illustrates the result of performing the shallow trench mask and etch procedure on each of the four semiconductor devices. As shown in FIG. 11, a photoresist mask 1110 is placed over the four devices and openings are etched through the photoresist mask 1110 over the devices. The arrows in FIG. 11 represent the etch procedure. In an advantageous embodiment of the invention the etch procedure etches through the 0.185 micron thick nitride layer 1010, then through the 0.025 micron thick epi oxide layer 610, and then through a thickness of approximately one and thirty four hundredths micron (1.34μ) of the underlying active silicon layer 130.

Persons who are skilled in the art will recognize that the shallow trench isolation technique is one of several methods that are available for separating individual components within a transistor or for separating individual devices from each other. The shallow trench isolation technique represents a best mode of the apparatus of the invention. As previously mentioned, other types of isolation techniques may also be used.

In the next step of the manufacturing method of the invention a mask and implant procedure is performed to form channel stops in the PNP device and in the NMOS device. FIG. 12 illustrates the procedure. The previous photoresist mask 1110 is removed and the four semiconductor devices are covered with a photoresist mask 1210. The photoresist mask 1210 then etched to create openings over the PNP device and over the NMOS device. The arrows in FIG. 12 illustrate the implant doping procedure for forming the channel stops. Channel stops 1220, 1230 and 1240 are formed in the shallow trench areas of the PNP device. Channel stops 1250, 1260 and 1270 are formed in the shallow trench areas of the NMOS device.

Persons who are skilled in the art will recognize that the channel stops may or may not be necessary depending upon the details of the isolation technique that is used.

In the next step of the manufacturing method of the invention a mask and etch procedure is performed to form deep trenches to isolate the NPN device, the PNP device, the NMOS device, and the PMOS device, respectively. As shown in FIG. 13, a photoresist mask 1310 is applied over the four devices. The photoresist mask 1310 is then etched to create openings at the edges of each of the four devices. The arrows in FIG. 13 illustrate the etch procedure for forming the deep trenches 1320. In an advantageous embodiment of the invention each deep trench 1320 is approximately three and five tenths microns (3.5μ) microns to four and seven tenths microns (4.7μ) in depth and approximately one micron (1.0μ) in width. Each deep trench 1320 extends to and contacts the underlying buried oxide layer 120.

Persons who are skilled in the art will recognize that the deep trench isolation technique is one of several methods that are available for separating individual devices from each other. The deep trench isolation technique represents a best mode of the apparatus of the invention. As previously mentioned, other types of isolation techniques may also be used.

In the next step of the manufacturing method of the invention a trench liner oxidation layer is placed over each of the four devices. FIG. 14 illustrates the location of the trench liner oxidation layer 1410. In an advantageous embodiment of the invention the trench liner oxidation layer 1410 is approximately six hundred fifty Ångstroms (650 Å) or sixty five thousandths of a micron (0.065μ).

The trench liner oxidation layer step also serves to anneal the implant damage from the preceding implants. The trench liner oxidation layer step also diffuses the sinkers and well through the epi to the buried layers.

In the next step of the manufacturing method of the invention a trench fill oxide base layer is placed over the four devices. FIG. 15 illustrates the location of the trench fill oxide base layer 1510. In an advantageous embodiment of the invention the trench fill oxide base layer 1510 is approximately three thousand Ångstroms (3000 Å) or three tenths of a micron (0.30μ).

The use of trench fill oxide base layer 1510 represents a best mode of the apparatus of the invention. The trench fill material that is used could be another type of dielectric material, or a polysilicon material, or some other suitable material. Alternatively, the trench could be oxidized closed. In the next step of the manufacturing method of the invention the trench fill oxide base layer 1510 is etched back. FIG. 16 illustrates the etched form of the trench fill oxide base layer 1510. In an advantageous embodiment of the invention the trench fill oxide base layer 1510 is etched back so that its thickness is approximately two thousand four hundred Ångstroms (2400 Å) or twenty four hundredths of a micron (0.240μ).

The etch back step for the trench fill is necessary only if the aspect ratio of the trench is such that an improvement is needed to close the gap between the sidewalls of the trench as the trench fill material is deposited.

An oxide layer 1710 is placed over the NPN device, the PNP device, the NMOS device, and the PMOS device, respectively. In an advantageous embodiment of the invention the thickness of the oxide layer 1710 is approximately sixteen thousand six hundred Ångstroms (16,600 Å) or one and sixty six hundredths micron (1.66μ). The placement of oxide layer 1710 is illustrated in FIG. 17.

In the next step of the manufacturing method of the invention a reverse trench mask and a partial wet etch procedure are performed. A photoresist mask 1820 is then placed over the oxide layer 1710. The placement of photoresist mask 1820 is illustrated in FIG. 18. The photoresist mask 1820 then etched to create openings over the active areas of the four semiconductor devices. A partial wet etch is then performed to etch the oxide layer 1710 over the active areas. In an advantageous embodiment of the invention the wet etch procedure leaves a thickness of oxide layer 1710 over the active areas that is equal to approximately three thousand Ångstroms (3000 Å) or three tenths of a micron (0.30μ).

The reverse trench mask and the partial wet etch procedure shown in FIG. 18 is an optional step. The reverse trench mask and the partial wet etch simplifies the chemical mechanical polishing (CMP) procedure. The simplification of the CMP could be addressed in other ways (such as pattern density rules) or omitted altogether.

In the next step of the manufacturing method of the invention the photoresist mask 1820 is removed and a chemical mechanical polishing (CMP) procedure is applied to the four semiconductor devices. FIG. 19 illustrates the result of applying the chemical mechanical polishing (CMP) procedure. In an advantageous embodiment of the invention the thickness of the nitride layer 1010 is approximately nine hundred fifty Ångstroms (950 Å) or ninety five thousandths of a micron (0.095μ).

In the next step of the manufacturing method of the invention a trench fill densification procedure is performed. The trench fill densification procedure densifies the deposited dielectric oxide layer 1710. The trench fill densification procedure also serves to complete diffusion of the sinkers and bipolar P well.

In the next step of the manufacturing method of the invention a nitride and oxide wet strip procedure is performed on the four semiconductor devices. First the oxide layer 1710 is etched down to the surface of the nitride layer 1010 in each device. Then the nitride layer 1010 in each device is stripped away. Then the oxide layer 610 located under the nitride layer 1010 is also stripped away. FIG. 20 illustrates the appearance of the NPN device, the PNP device, the NMOS device and the PMOS device after these steps have been taken.

In the next step of the manufacturing method of the invention a sacrificial oxide layer is applied over the active areas of the four semiconductor devices. FIG. 21 illustrates the location of the sacrificial oxide layer 2110. In an advantageous embodiment of the invention the thickness of the sacrificial oxide layer 2110 is approximately four hundred Ångstroms (400 Å) or four hundredths of a micron (0.04μ).

In the next step of the manufacturing method of the invention a CMOS N well is implanted in the PMOS device. FIG. 22 illustrates the application of the procedure for implanting a CMOS N Well 2220 in the PMOS device. A photoresist mask 2210 is placed over the four devices and an opening is etched through the photoresist mask 2210 over the PMOS device. The arrows in FIG. 22 illustrate the implant doping procedure for forming the CMOS N well 2220 in the PMOS device.

In the next step of the manufacturing method of the invention a CMOS P well is implanted in the NMOS device. FIG. 23 illustrates the application of the procedure for implanting a CMOS P Well 2320 in the NMOS device. The photoresist mask 2210 is removed and a photoresist mask 2310 is placed over the four devices. An opening is etched through the photoresist mask 2310 over the NMOS device. The arrows in FIG. 23 illustrate the implant doping procedure for forming the CMOS P well 2320 in the NMOS device.

This advantageous embodiment of the invention uses implanted retrograde wells with included threshold adjust and anti-punchthrough implants through a sacrificial oxide. This embodiment represents the best mode of the apparatus of the invention. Persons who are skilled in the art will recognize that other methods exist for forming the well and channel doping including (but not limited to) an earlier implanted and driven well (with or without threshold adjust) either through a sacrificial oxide through the gate oxide or through the gate poly and gate oxide.

In the next step of the manufacturing method of the invention the photoresist mask 2310 is removed. A pre-gate plasma etch procedure is then performed. Then the oxide layer 1710 is etched down to the level of the surface of the CMOS P well 2320 and the surface of the CMOS N well 2220. The oxide layer 1710 is also etched down to the level of the surface of the NPN device and the PNP device. Then a gate oxide layer 2410 is grown over the active areas of the four semiconductor devices. FIG. 24 illustrates the result. In an advantageous embodiment of the invention the thickness of the gate oxide layer 2410 is approximately one hundred fifty Ångstroms (150 Å) or fifteen thousandths of a micron (0.015μ).

The pre-gate plasma etch procedure is not part of the invention. The pre-gate plasma etch procedure is an optional step that is used to improve gate oxide integrity. Other control flow processes may use a shallow trench technique without using the pre-gate plasma etch procedure.

In the next step of the manufacturing method of the invention a protective layer of polysilicon is deposited over the four semiconductor devices. FIG. 25 shows the protective layer of polysilicon 2510. The purpose of the protective layer of polysilicon 2510 is to protect the NMOS device and the PMOS device. In an advantageous embodiment of the invention the thickness of the polysilicon layer 2510 is approximately one thousand Ångstroms (1000 Å) or one tenth of a micron (0.10μ).

In the next step of the manufacturing method of the invention the polysilicon layer 2510 is removed from the NPN device and from the PNP device. A photoresist mask 2610 is placed over the NMOS device and over the PMOS device. The polysilicon layer 2510 is then etched from the NPN device and from the PNP device. As shown in FIG. 26, the polysilicon layer 2510 remains in place over the NMOS device and over the PMOS device.

Persons who are skilled in the art will recognize this step as a merged poly method that is commonly used in Bipolar CMOS (BiCMOS) devices with poly emitters. The merged poly method represents a best mode of the apparatus of the invention. Alternatively, this process could be done without the merged poly and masking and etching the gate oxide prior to the deposition of the first layer of polysilicon (Poly1).

In the next step of the manufacturing method of the invention the photoresist mask 2610 is removed from the NMOS device and from the PMOS device. A selective etch is performed that removes the gate oxide 2410 from the NPN device and the PNP device but does not etch the poly protect layer 2510 or the underlying gate oxide 2410 on the PMOS device or the NMOS device. A layer of polysilicon 2700 (Poly1) is then deposited on the four semiconductor devices. FIG. 27 illustrates the deposition of the layer of polysilicon 2700 (Poly1) over the four semiconductor devices. The layer of polysilicon 2700 covers the protective layer of polysilicon 2510 on the NMOS device and on the PMOS device. The layer of polysilicon 2700 is in direct contact with the monosilicon in the NPN device and the PNP device. In an advantageous embodiment of the invention the thickness of the layer of polysilicon 2700 (Poly1) is approximately two thousand Ångstroms (2000 Å) or two tenths of a micron (0.20μ).

In the next step of the manufacturing method of the invention a portion of the Poly1 layer (polysilicon layer 2700) is doped to form an extrinsic base in the PNP device and an NMOS gate in the NMOS device. FIG. 28 illustrates the implantation procedure. A photoresist mask 2800 is placed over the four semiconductor devices and openings are etched through the photoresist mask 2800 over the PNP device and over the NMOS device. The three arrows in FIG. 28 illustrate the implant doping procedure for doping the polysilicon layer 2700 to form an extrinsic base in the PNP device. The doped portion is denoted with the reference numeral 2810. The single arrow in FIG. 28 illustrates the implant doping procedure for doping the polysilicon layer 2700 (and the polysilicon layer 2510) to form an NMOS gate in the NMOS device. The doped portion is denoted with the reference numeral 2820.

Persons who are skilled in the art will recognize that the method described above is one of several available methods for doping the polysilicon layer 2700 (and the polysilicon layer 2510). Some of the other available methods include (1) diffusion from a doped glass and (2) in situ doping of the polysilicon with phosphorus or arsenic.

In the next step of the manufacturing method of the invention a portion of the Poly1 layer (polysilicon layer 2700) is doped to form an extrinsic base in the NPN device and a PMOS gate in the PMOS device. FIG. 29 illustrates the implantation procedure. A photoresist mask 2900 is placed over the four semiconductor devices and openings are etched through the photoresist mask 2900 over the NPN device and over the PMOS device. The three arrows in FIG. 29 illustrate the implant doping procedure for doping the polysilicon layer 2700 to form an extrinsic base in the NPN device. The doped portion is denoted with the reference numeral 2910. The single arrow in FIG. 29 illustrates the implant doping procedure for doping the polysilicon layer 2700 (and the polysilicon layer 2510) to form a PMOS gate in the PMOS device. The doped portion is denoted with the reference numeral 2920.

As previously mentioned, persons who are skilled in the art will recognize that the method described above is one of several available methods for doping the polysilicon layer 2700. Other methods also exist for doping the polysilicon layer 2700.

In the next step of the manufacturing method of the invention a layer of an Inter Poly Dielectric (IPD) is deposited over the four semiconductor devices. FIG. 30 illustrates the result of the deposition of the Inter Poly Dielectric (IPD) layer 3000. The Inter Poly Dielectric (IPD) layer 3000 is made up of undoped TEOS. In an advantageous embodiment of the invention the thickness of the Inter Poly Dielectric (IPD) layer 3000 is approximately two thousand three hundred Ångstroms (2300 Å) or twenty three hundredths of a micron (0.23μ).

Persons who are skilled in the art will recognize that alternative types of dielectrics may also be used. For example, silicon nitride may be used in place of undoped TEOS in Inter Poly Dielectric (IPD) layer 3000. Alternative methods also exist for forming the Inter Poly Dielectric (IPD) layer 3000. For example, the IPD layer 3000 may be formed with a spin on glass (SOG) method, by a chemical vapor deposition (CVD) method, or by oxidizing part of the poly layer itself.

In the next step of the manufacturing method of the invention a mask and etch procedure is performed to etch portions of the Inter Poly Dielectric (IPD) layer 3000 and portions of the Poly1 layer 2700 over the NPN device and over the PNP device. FIG. 31 illustrates the mask and etch procedure. A photoresist mask 3100 is placed over the four semiconductor devices. Openings are etched through the photoresist mask 3100 over the NPN device and over the PNP device. The photoresist mask 3100 covers the NMOS device and the PMOS device.

As shown in FIG. 31, the etch procedure etches through the Inter Poly Dielectric (IPD) layer 3000 located over the doped Poly1 layer 2910 to form extrinsic bases in the NPN device. The etch procedure then etches through the doped Poly1 layer 2910 to form a passageway through the doped Poly1 layer 2910 down to the underlying E epi layer 510. In one advantageous embodiment the boundaries of the passageway are in the form of a rectangle. In the cross sectional view shown in FIG. 31 the passageway apparently divides doped Poly1 layer 2910 into a first portion 3120 and a second portion 3130. The portion of the doped Poly1 layer 2910 that is represented by the first portion 3120 and the portion of the doped Poly1 layer 2910 that is represented by the second portion 3130 are actually connected by unetched portions of doped Poly1 layer 2910 (not shown in FIG. 31). Similarly, the etch procedure also etches through the Inter Poly Dielectric (IPD) layer 3000 and the undoped Poly1 layer 2700 down to the N+ sinker 820 in the NPN device.

As also shown in FIG. 31, the etch procedure etches through the Inter Poly Dielectric (IPD) layer 3000 located over the doped Poly1 layer 2810 to form extrinsic bases in the PNP device. The etch procedure then etches through the doped Poly1 layer 2810 to form a passageway through the doped Poly1 layer 2810 down to the underlying P well 720. In one advantageous embodiment the boundaries of the passageway are in the form of a rectangle. In the cross sectional view shown in FIG. 31 the passageway apparently divides doped Poly1 layer 2810 into a first portion 3140 and a second portion 3150. The portion of the doped Poly1 layer 2810 that is represented by the first portion 3140 and the portion of the doped Poly1 layer 2810 that is represented by the second portion 3150 are actually connected by unetched portions of doped Poly1 layer 2810 (not shown in FIG. 31). Similarly, the etch procedure also etches through the Inter Poly Dielectric (IPD) layer 3000 and the undoped Poly1 layer 2700 down to the P+ sinker 920 in the PNP device.

In the next step of the manufacturing method of the invention a mask and etch procedure is performed to etch portions of the Inter Poly Dielectric (IPD) layer 3000 and portions of the Poly1 layer 2700 and protective poly layer 2510 over the NMOS device and over the PMOS device. FIG. 32 illustrates the mask and etch procedure. A photoresist mask 3200 is placed over the four semiconductor devices. Openings are etched through the photoresist mask 3200 over the NMOS device and over the PMOS device. The photoresist mask 3200 covers the NPN device and the PNP device.

As shown in FIG. 32, the etch procedure etches through the Inter Poly Dielectric (IPD) layer 3000 and the Poly1 layer 2700 and the polysilicon layer 2510 located on each side of the doped Poly1 layer 2820 to form an NMOS gate 2820 in the NMOS device. The etch procedure also etches through portions of the doped Poly1 layer 2820 and protective poly layer 2510 to decrease the length of the doped Poly1 layer 2820. The etch procedure also etches through the Inter Poly Dielectric (IPD) layer 3000 and the Poly1 layer 2700 and the polysilicon layer 2510 down to the P+ well contact 930 in the NMOS device.

As also shown in FIG. 32, the etch procedure etches through the Inter Poly Dielectric (IPD) layer 3000 and the Poly1 layer 2700 and the polysilicon layer 2510 located on each side of the doped Poly1 layer 2920 to form a PMOS gate 2920 in the PMOS device. The etch procedure also etches through portions of the doped Poly1 layer 2920 to decrease the length of the doped Poly1 layer 2920. The etch procedure also etches through the Inter Poly Dielectric (IPD) layer 3000 and the Poly1 layer 2700 and the polysilicon layer 2510 down to the N+ well contact 830 in the PMOS device.

In this advantageous embodiment of the invention the Poly1 layer 2700 and the Inter Poly Dielectric (IPD) layer 3000 for the MOS devices are masked and etched in two separate steps due to the numerous and sometimes conflicting requirements for the etches. Persons who are skilled in the art will recognize that these mask and etch steps could be combined into one step.

In the next step of the manufacturing method of the invention the photoresist mask 3200 is removed and a rapid thermal processing (RTP) and furnace procedure is performed. Diffusion and oxidation causes dopant from the extrinsic bases to diffuse into the diffused extrinsic base areas of the NPN device and the PNP device. FIG. 33 illustrates the result of this procedure. In the NPN device dopant from the doped Poly1 layer 3120 (extrinsic base 3120) diffuses into the diffused extrinsic base area 3310 and dopant from the doped Poly1 layer 3130 (extrinsic base 3130) diffuses into the diffused extrinsic base area 3320. In the PNP device dopant from the doped Poly1 layer 3140 (extrinsic base 3140) diffuses into the diffused extrinsic base area 3330 and dopant from the doped Poly1 layer 3150 (extrinsic base 3150) diffuses into the diffused extrinsic base area 3340. In an advantageous embodiment of the invention the depth of each of the doped diffused extrinsic base areas 3310, 3320, 3330 and 3340, is approximately one thousand five hundred Ångstroms (1500 Å) or fifteen hundredths of a micron (0.15µ).

At the same time, a screen oxide layer 3350 is grown over the intrinsic base areas and the sinkers of the NPN device and the PNP device. The thickness of the screen oxide layer 3350 is approximately one hundred fifty Ångstroms (150 Å) or fifteen thousandths of a micron (0.015µ). Screen oxide layer 3350 is shown in FIG. 33. For clarity screen oxide layer 3350 will not be shown in the remaining drawings.

Persons who are skilled in the art will recognize that based on the constraints of the intrinsic base implants and the spacer deposition and etchback, it is possible to skip this heat cycle and combine this heat cycle into one or more other heat cycles.

In the next step of the manufacturing method of the invention an implantation procedure is used to dope an intrinsic base of the NPN device and to dope Lightly Doped Drains (LDDS) in the PMOS device. The procedure is illustrated in FIG. 34. A photoresist mask 3400 is placed over the four semiconductor devices. Openings are etched through the photoresist mask 3400 over the NPN device and over the PMOS device. The photoresist mask 3400 covers the PNP device and the NMOS device.

The four arrows in FIG. 34 illustrate the implant doping procedure for doping the intrinsic base 3410 in the NPN device. The two arrows in FIG. 34 illustrate the implant doping procedure for doping the Lightly Doped Drains (LDDs) in the PMOS device. The two Lightly Doped Drains (LDDs) in the PMOS device are denoted with reference numerals 3420 and 3430.

In this advantageous embodiment of the invention the implant is conducted at a large angle and at four rotations of the semiconductor wafer.

In the next step of the manufacturing method of the invention an implantation procedure is used to dope an intrinsic base of the PNP device and to dope Lightly Doped Drains (LDDs) of the NMOS device. The procedure is illustrated in FIG. 35. A photoresist mask 3500 is placed over the four semiconductor devices. Openings are etched through the photoresist mask 3500 over the PNP device and over the NMOS device. The photoresist mask 3500 covers the NPN device and the PMOS device.

The four arrows in FIG. 35 illustrate the implant doping procedure for doping the intrinsic base 3510 in the PNP device. The two arrows in FIG. 35 illustrate the implant doping procedure for doping Lightly Doped Drains (LDDs) in the NMOS device. The two Lightly Doped Drains (LDDs) in the NMOS device are denoted with reference numerals 3520 and 3530.

In this advantageous embodiment of the invention the implant is conducted at a large angle and at four rotations of the semiconductor wafer.

In the next step of the manufacturing method of the invention a nitride spacer layer is deposited over the four semiconductor devices. FIG. 36 illustrates the location of the nitride spacer layer 3600. In an advantageous embodiment of the invention the thickness of each of the nitride spacer layer 3600 is approximately two thousand nine hundred Ångstroms (2900 Å) or twenty nine hundredths of a micron (0.290µ). Persons who are skilled in the art will recognize that other materials could be used in place of the nitride spacer layer 3600.

In the next step of the manufacturing method of the invention the nitride spacer layer 3600 is etched back as shown in FIG. 37. The portions of nitride spacer layer 3600 that remain after the etching procedure form protective sidewalls for the elements of the four semiconductor devices.

In the next step of the manufacturing method of the invention portions of the screen oxide layer 3350 that are not covered by the nitride spacer layer 3600 are removed from the intrinsic base areas of the NPN device and the PNP device and from the source drain areas of the NMOS device and the PMOS device and a layer of polysilicon (Poly2) is deposited over the four semiconductor devices. FIG. 38 illustrates the location of the polysilicon (Poly2) layer 3800. In an advantageous embodiment of the invention the thickness of the polysilicon (Poly2) layer 3800 is approximately two thousand Ångstroms (2000 Å) or twenty hundredths of a micron (0.20µ). Persons who are skilled in the art will recognize that a thin oxide layer will be formed between the Poly2 layer 3800 and the monocrystalline silicon. In an advantageous embodiment of the invention the thickness of this interfacial oxide layer is approximately twelve Ångstroms (12 Å) to fifteen Ångstroms (15 Å) or approximately twelve ten thousandths of a micron (0.0012µ) to fifteen ten thousandths of a micron (0.0015µ).

In an advantageous embodiment of the invention a thermal process is now performed to break up the interfacial oxide layer between the Poly2 layer 3800 and the intrinsic base in the monocrystalline silicon area. At the same time, damage from the implant of the intrinsic bases is annealed and the intrinsic bases are driven in a heat step that is independent from the step used to drive the emitter dopant. Persons who are skilled in the art will recognize that this step may be combined with the emitter drive heat cycle.

In the next step of the manufacturing method of the invention a portion of the Poly2 layer (polysilicon layer 3800) is doped in the NPN device and in the NMOS device and in the PMOS device. FIG. 39 illustrates the implantation procedure. A photoresist mask 3900 is placed over the four semiconductor devices and openings are etched through the photoresist mask 3900 over the NPN device and over the NMOS device and over the PMOS device. The five arrows in FIG. 39 over the NPN device illustrate the implant doping procedure for doping the polysilicon layer 3800 in the NPN device. The doped portion of the emitter of the NPN device is denoted with the reference numeral 3910 (NPN emitter 3910). The doped portion of polysilicon layer 3800 over N+ sinker 820 is denoted with the reference numeral 3920 (NPN deep collector 3920).

The four arrows in FIG. 39 over the NMOS device illustrate the implant doping procedure for doping the polysilicon layer 3800 in the NMOS device. The doped portion of polysilicon layer 3800 in the NMOS device is denoted with the reference numeral 3930 (NMOS source/drain 3930).

The two arrows in FIG. 39 over the PMOS device illustrate the implant doping procedure for doping the polysilicon layer 3800 in the PMOS device. The doped portion of polysilicon layer 3800 in the PMOS device is denoted with the reference numeral 3940 (PMOS well contact 3940).

In the next step of the manufacturing method of the invention a portion of the Poly2 layer (polysilicon layer 3800) is doped in the PNP device and in the NMOS device and in the PMOS device. FIG. 40 illustrates the implantation procedure. A photoresist mask 4000 is placed over the four semiconductor devices and openings are etched through the photoresist mask 4000 over the PNP device and over the NMOS device and over the PMOS device. The five arrows in FIG. 40 over the PNP device illustrate the implant doping procedure for doping the polysilicon layer 3800 in the PNP device. The doped portion of the emitter of the PNP device is denoted with the reference numeral 4010 (PNP emitter 4010). The doped portion of polysilicon layer 3800 over P+ sinker 920 is denoted with the reference numeral 4020 (PNP deep collector 4020).

The two arrows in FIG. 40 over the NMOS device illustrate the implant doping procedure for doping the polysilicon layer 3800 in the NMOS device. The doped portion of polysilicon layer 3800 in the NMOS device is denoted with the reference numeral 4030 (NMOS well contact 4030).

The four arrows in FIG. 40 over the PMOS device illustrate the implant doping procedure for doping the polysilicon layer 3800 in the PMOS device. The doped portion of polysilicon layer 3800 in the PMOS device is denoted with the reference numeral 4040 (PMOS source/drain 4040).

In the next step of the manufacturing method of the invention portions of the Poly2 layer (polysilicon layer 3800) are etched to define the emitters and collectors of the NPN device and of the PNP device and to define the sources and drains of the NMOS device and of the PMOS device. As shown in FIG. 41, the photoresist mask 4000 from the previous step is removed and a photoresist mask 4100 is placed over the four semiconductor devices.

The etch procedure etches away exposed portions of the Poly2 layer 3800 and exposed portions of the sidewalls formed from nitride layer 3600. The etch procedure also etches away end portions of the doped Poly2 layer 3910 (NPN emitter 3910) and end portions of the doped Poly2 layer 3920 (NPN deep collector 3920) in the NPN device. The etch procedure also etches away end portions of the doped Poly2 layer 4010 (PNP emitter 4010) and end portions of the doped Poly2 layer 4020 (PNP deep collector 4020) in the PNP device.

The etch procedure also etches through a central portion of the doped Poly2 layer 3930 (NMOS source/drain 3930) in the NMOS device down to the Inter Poly Dielectric (IPD) layer 3000. This separates the source portion from the drain portion in the NMOS device. The etch procedure also etches away end portions of the doped Poly2 layer 4030 (NMOS well contact 4030) in the NMOS device.

The etch procedure also etches through a central portion of the doped Poly2 layer 4040 (PMOS source/drain 4040) in the PMOS device down to the Inter Poly Dielectric (IPD) layer 3000. This separates the source portion from the drain portion in the PMOS device. The etch procedure also etches away end portions of the doped Poly2 layer 3940 (PMOS well contact 3940) in the PMOS device.

In the next step of the manufacturing method of the invention an etch procedure is performed to etch portions of the Inter Poly Dielectric (IPD) layer 3000 and portions of the trench fill material on each of the four semiconductor devices. As shown in FIG. 42 the exposed portions of the Inter Poly Dielectric (IPD) layer 3000 are removed. The central portion of the Inter Poly Dielectric (IPD) layer 3000 over the doped polysilicon (Poly1) layer 2820 (NMOS gate 2820) in the NMOS device is etched away. The central portion of the Inter Poly Dielectric (IPD) layer 3000 over the doped polysilicon (Poly1) layer 2920 (PMOS gate 2920) in the PMOS device is also etched away. In addition, portions of the trench fill material 1710 on each of the four semiconductor devices are etched away as shown in FIG. 42.

In the next step of the manufacturing method of the invention the photoresist mask 4100 is removed and a rapid thermal processing (RTP) procedure is performed to activate the PNP emitter, the NPN emitter, the source and drain of the NMOS device, and the source and drain of the PMOS device. FIG. 43 illustrates the result of applying the RTP procedure. Diffusion and oxidation causes dopant from the NPN emitter 3910 to diffuse into the intrinsic base 3410 of the NPN device. The doped area is denoted with the reference numeral 4310 (emitter region 4310).

Similarly, diffusion and oxidation causes dopant from the PNP emitter 4010 to diffuse into the intrinsic base 3510 of the PNP device. The doped area is denoted with the reference numeral 4320 (emitter region 4320).

In addition, diffusion and oxidation causes dopant from the doped polysilicon (Poly2) layer 3930 in the NMOS device to diffuse into the Lightly Doped Drain (LDD) 3520 and into the Lightly Doped Drain (LDD) 3530 in the NMOS device. The area doped in LDD 3520 is denoted with the reference numeral 4330. The area doped in LDD 3530 is denoted with the reference numeral 4340.

Similarly, diffusion and oxidation causes dopant from the doped polysilicon (Poly2) layer 4040 in the PMOS device to diffuse into the Lightly Doped Drain (LDD) 3420 and into the Lightly Doped Drain (LDD) 3430 in the PMOS device. The area doped in LDD 3420 is denoted with the reference numeral 4350. The area doped in LDD 3430 is denoted with the reference numeral 4360. The results of these steps are illustrated in FIG. 43.

Figure 44:
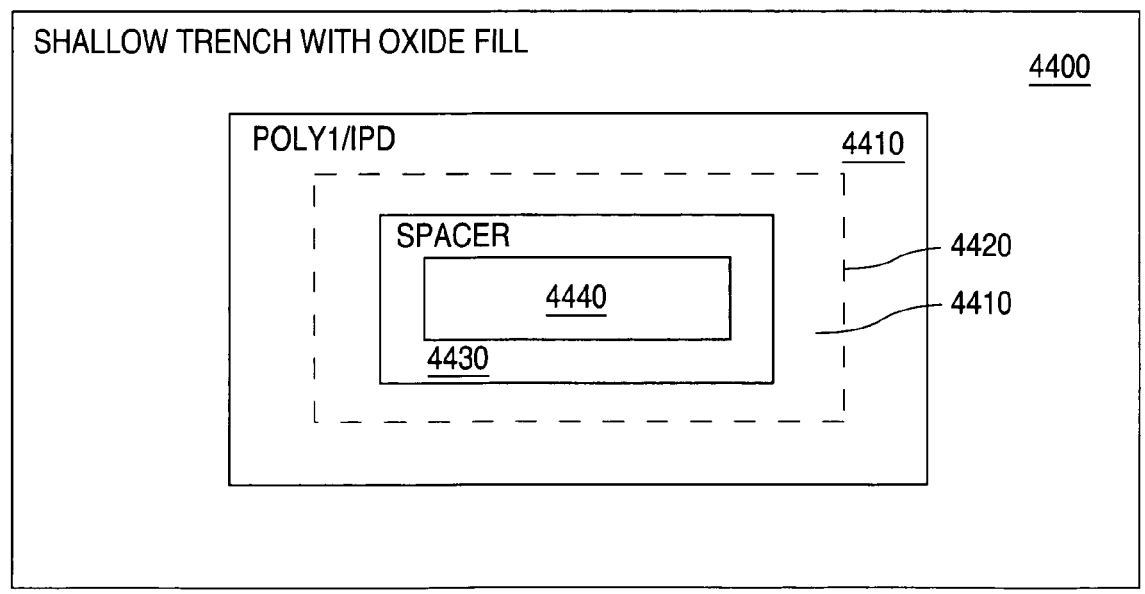
FIG. 44 illustrates a diagrammatic plan view of the top of an exemplary rectangular opening etched into a doped Poly1 layer of a bipolar semiconductor device of the invention.
Figure 47A:
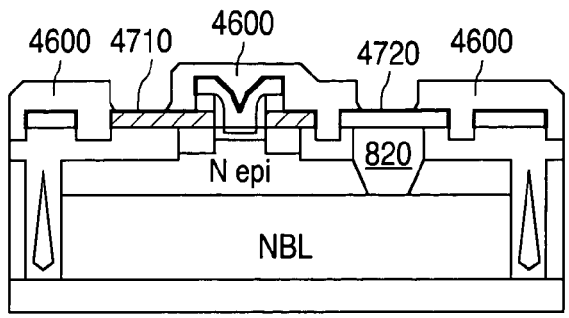
FIG. 47 illustrates the result of performing a mask and etch procedure to etch portions of the layer of tetra ethyl ortho silicate (TEOS) over the four semiconductor devices to receive metal contacts.
Figure 47B:
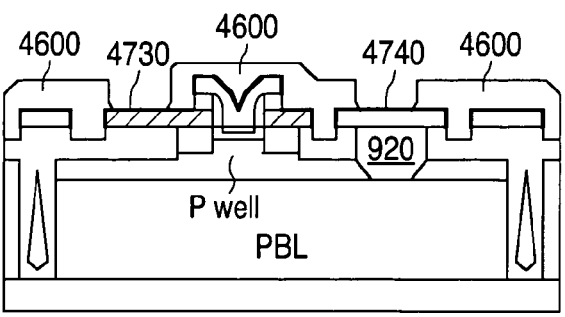
Figure 47C:
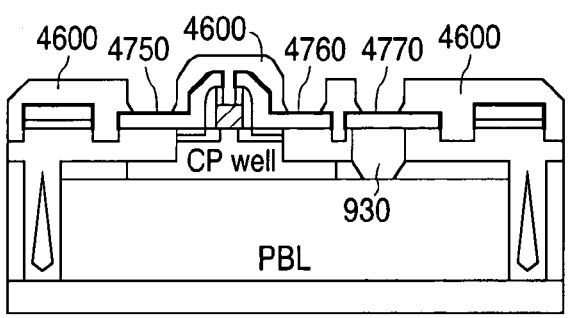
Figure 47D:
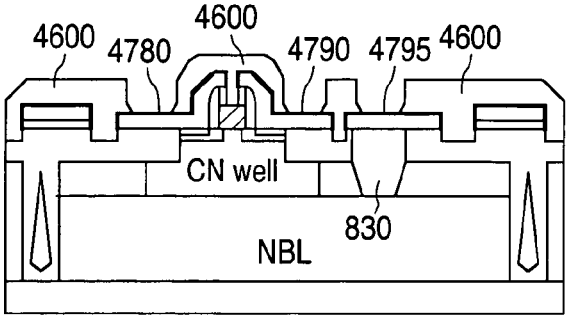
Figure 48A:
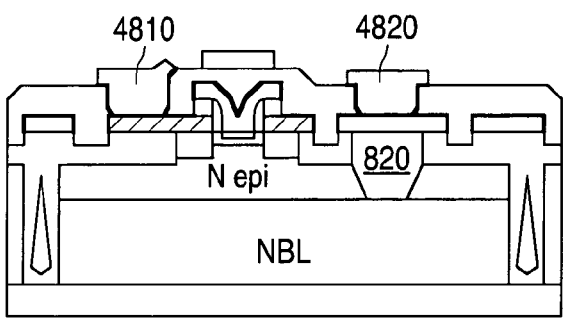
FIG. 48 illustrates the placement of metal contacts within contact receptacles in the four semiconductor devices.
Figure 48B:
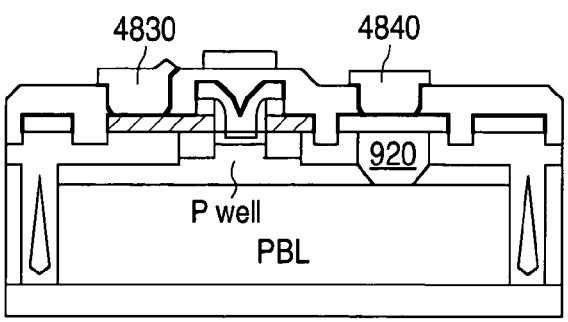
Figure 48C:
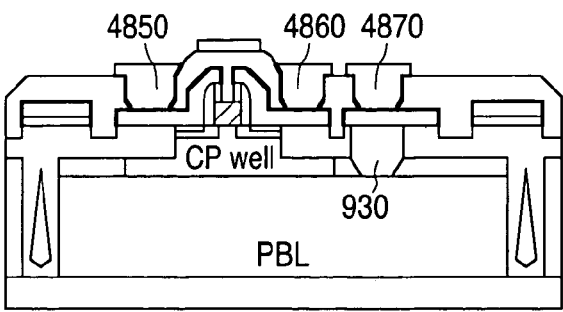
Figure 48D:
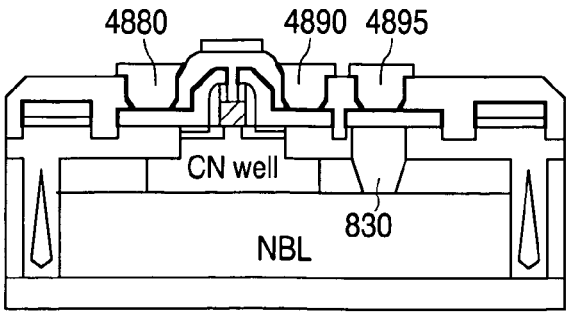

FIG. 44 illustrates a diagrammatic plan view of the top of an exemplary rectangular opening etched into the doped Poly1 layer 2910 of the NPN semiconductor device. The outer portions 4400 around the opening represent the surrounding shallow trench with oxide fill. The portions denoted with reference numeral 4410 represent the doped layer of Poly1 material 2910 (and overlying Inter Poly Dielectric (IPD) layer 3000). The dotted line 4420 denotes the extent of the area of mononcrystalline silicon under the Poly1 material 2910 (and the overlying IPD layer 3000). The inner rectangle denoted with reference numeral 4430 represents the spacer material 3600. The portion denoted with reference numeral 4440 represents the area of the intrinsic base 3410 in the monocrystalline silicon portion of the NPN device.

The intrinsic base implant 3410 goes into the monocrystalline silicon area 4440 in the center of the rectangle. The spacer material 3600 forms an inner rectangle 4430 inside the center of the Poly1/IPD rectangle 4410. When the doped Poly2 layer 3910 is placed in contact with the monocrystalline silicon area 4440, then the spacer material 3600 separates the doped Poly2 layer 3910 from all four inner walls of the Poly1/IPD material. A similar structure is also used in the PNP semiconductor device.

In the next step of the manufacturing method of the invention a cobalt silicide layer is formed over the four semiconductor devices. FIG. 45 illustrates the location of the cobalt silicide layer 4500. The cobalt silicide layer 4500 covers all polysilicon Poly2 layers and all polysilicon Poly1 layers that are not under a polysilicon Poly2 layer. In an advantageous embodiment of the invention the thickness of each of the cobalt silicide layer 4500 is approximately two hundred fifty Ångstroms (250 Å) or twenty five thousandths of a micron (0.025µ).

Persons who are skilled in the art will recognize that alternative silicides could also be used (e.g., titanium). Alternatively, the device could be made without silicide.

In the next step of the manufacturing method of the invention a layer of tetra ethyl ortho silicate (TEOS) is deposited over the four semiconductor devices. FIG. 46 illustrates the location of the TEOS layer 4600. In an advantageous embodiment of the invention the thickness of the TEOS layer 4600 is approximately six thousand five hundred Ångstroms (6500 Å) or sixty five hundredths of a micron (0.65µ).

In the next step of the manufacturing method of the invention a mask and etch procedure is performed to etch portions of the TEOS layer 4600 over the four semiconductor devices to receive metal contacts. A contact photoresist mask (not shown) is placed over the four semiconductor devices. An etch procedure then etches the TEOS layer 4600 down to the level of the cobalt silicide 4500. The result is shown in FIG. 47. Contact receptacle 4710 and contact receptacle 4720 are formed in the TEOS layer 4600 of the NPN device. Contact receptacle 4730 and contact receptacle 4740 are formed in the TEOS layer 4600 of the PNP device.

Similarly, contact receptacle 4750, contact receptacle 4760 and contact receptacle 4770 are formed in the TEOS layer 4600 of the NMOS device. Contact receptacle 4780, contact receptacle 4790 and contact receptacle 4795 are formed in the TEOS layer 4600 of the NMOS device.

In the next step of the manufacturing method of the invention metal contacts are placed within the contact receptacles in the four semiconductor devices. The result is shown in FIG. 48. Metal contact 4810 is placed within contact receptacle 4710 and metal contact 4820 is placed within contact receptacle 4720 in the NPN device. Metal contact 4830 is placed within contact receptacle 4730 and metal contact 4840 is placed within contact receptacle 4740 in the PNP device.

Metal contact 4850 is placed within contact receptacle 4750 and metal contact 4860 is placed within contact receptacle 4760 and metal contact 4870 is placed within contact receptacle 4770 in the NMOS device.

Metal contact 4880 is placed within contact receptacle 4780 and metal contact 4890 is placed within contact receptacle 4790 and metal contact 4895 is placed within contact receptacle 4795 in the NMOS device.

Figure 49:
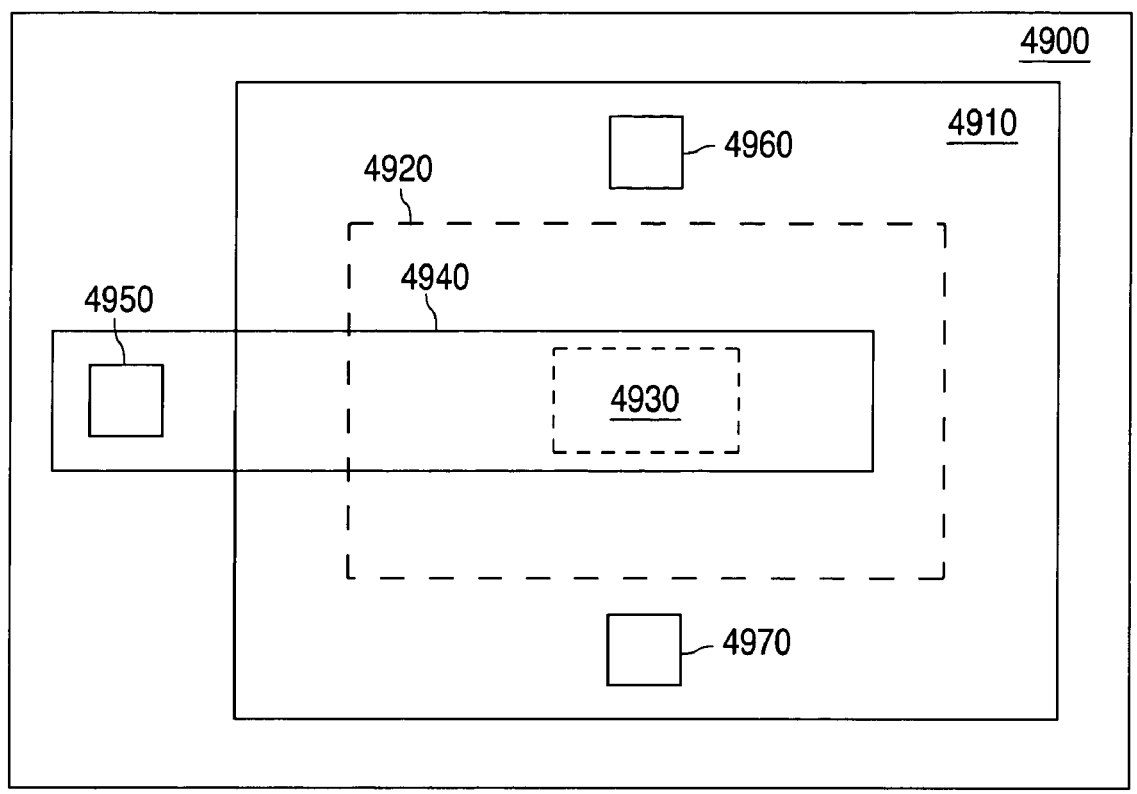
FIG. 49 illustrates a diagrammatic top plan view of the layout of an exemplary bipolar transistor of the invention.

FIG. 49 illustrates a diagrammatic top plan view of the layout of an exemplary bipolar transistor (NPN or PNP) of the invention. The outer portions 4900 represent the surrounding shallow trench with oxide fill. The portions denoted with reference numeral 4910 represent the doped layer of Poly1 material. The dotted line 4920 denotes the extent of the area of mononcrystalline silicon under the Poly1 material. The dotted line 4930 denotes the location of the opening through the Poly1/IPD layer down to the underlying monocrystalline silicon area (including the spacer material). The rectangle 4940 denotes the location of the doped Poly2 layer. In the area under Poly2 and over Poly1, the IPD remains between the two poly layers. Rectangle 4950, rectangle 4960 and rectangle 4970 each represent a contact hole in the TEOS filled with metal. Those persons who are familiar with the art will recognize that the emitter contact 4950 has been offset from the emitter hole in this advantageous embodiment of the invention. This permits the emitter area and surrounding monocrystalline extrinsic base area to be smaller which offers certain performance advantages. In the event that the performance advantages are not necessary, the emitter contact 4950 could be placed directly over the emitter doped Poly2 in contact with the monocrystalline intrinsic base 4930.

Figure 50:
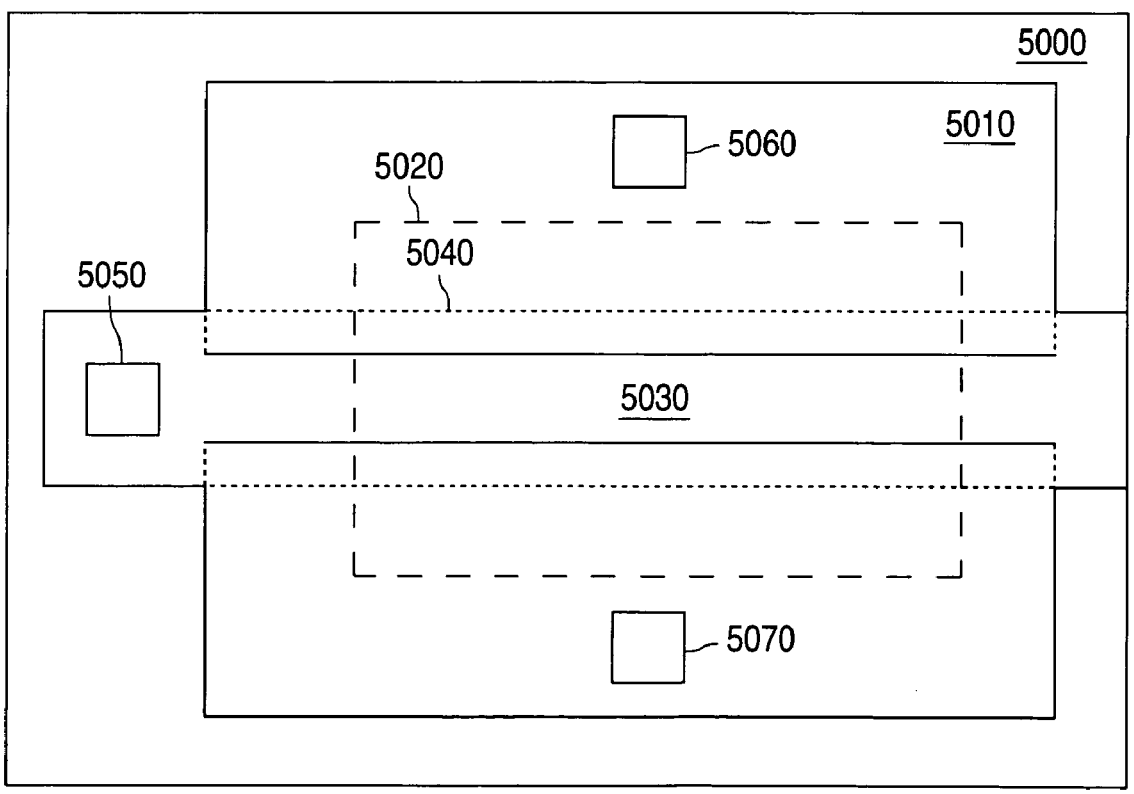
FIG. 50 illustrates a diagrammatic top plan view of the layout of an exemplary metal oxide semiconductor (MOS) transistor of the invention.

FIG. 50 illustrates a diagrammatic top plan view of the layout of an exemplary metal oxide semiconductor (MOS) transistor (NMOS or PMOS) of the invention. The outer portions 5000 represent the surrounding shallow trench with oxide fill. The portion denoted with reference numeral 5010 represents the Poly2 layer doped with emitter (the MOS source/drain). The dotted line 5020 denotes the extent of the area of active mononcrystalline silicon under the Poly1 material. The portion denoted with reference numeral 5030 represents the area of the Poly1 material that is doped with extrinsic base (the MOS gate). The dotted line 5040 represents the location of the Poly1/IPD layer underlying the overlap of the Poly2 material. Rectangle 5050, rectangle 5060 and rectangle 5070 each represent a contact hole in the TEOS filled with metal.

Those persons who are familiar with the art will recognize that the gate contact 5050 has been offset from the part of the gate poly enclosed by Poly2 in this advantageous embodiment of the invention. This permits the gate length to be smaller which offers certain performance advantages. In the event that these performance advantages are not necessary, the gate contact 5050 could be placed directly on the gate poly between the source Poly2 and drain Poly2.

An advantageous embodiment of the invention has been described in which two types of double poly bipolar transistors (NPN and PNP) are present in combination with two types of double poly MOS transistors (NMOS and PMOS). Persons who are skilled in the art will understand that alternate embodiments of the invention may comprise a combination of any two of the types of double poly transistors.

A combination of a PMOS transistor and an NPN bipolar transistor may be made by adding one mask for a P source drain. A combination of an NMOS transistor and a PNP bipolar transistor may be made by adding one mask for an N source drain. A combination of an NMOS transistor and an NPN bipolar transistor may be made by adding two masks for an NMOS Lightly Doped Drain (LDD) and an NMOS gate. A combination of a PMOS transistor and a PNP bipolar transistor may be made by adding two masks for a PMOS Lightly Doped Drain (LDD) and a PMOS gate.

Although the present invention has been described with an exemplary embodiment, various changes and modifications may be suggested to one skilled in the art. It is intended that the present invention encompass such changes and modifications as fall within the scope of the appended claims.

What is claimed is:

1. A semiconductor apparatus comprising a double poly bipolar transistor and a double poly metal oxide semiconductor (MOS) transistor;
    wherein a first polysilicon layer comprises a base of the double poly bipolar transistor and a gate of the double poly MOS transistor;
    wherein a second polysilicon layer separate from the first polysilicon layer comprises an emitter of the double poly bipolar transistor and a source/drain of the double poly MOS transistor;
    wherein the base of the double poly bipolar transistor comprises a first dopant having a first dopant concentration, and wherein the gate of the double poly MOS transistor comprises the first dopant having the first dopant concentration; and
    wherein the emitter of the double poly bipolar transistor comprises a second dopant having a second dopant concentration, and wherein the source/drain of the double poly MOS transistor comprises the second dopant having the second dopant concentration.

2. The semiconductor apparatus as set forth in claim 1, wherein:
    the first polysilicon layer comprises first polysilicon layer material in the double poly bipolar transistor and first polysilicon layer material in the double poly MOS transistor;
    the first polysilicon layer material in the double poly bipolar transistor comprises impurity ions of the first dopant forming the base of the double poly bipolar transistor, the base comprising an extrinsic base; and
    the first polysilicon layer material in the double poly MOS transistor comprises impurity ions of the first dopant forming the gate of the double poly MOS transistor.

3. The semiconductor apparatus as set forth in claim 2, wherein:
    the double poly bipolar transistor is a PNP transistor; and
    the double poly MOS transistor is an NMOS transistor.

4. The semiconductor apparatus as set forth in claim 2, wherein:
    the double poly bipolar transistor is an NPN transistor; and
    the double poly MOS transistor is a PMOS transistor.

5. The semiconductor apparatus as set forth in claim 2, further comprising:
    a substrate;
    impurity ions of a third dopant in the substrate forming an intrinsic base of the double poly bipolar transistor; and
    impurity ions of the third dopant in the substrate forming a lightly doped drain of the double poly MOS transistor.

6. The semiconductor apparatus as set forth in claim 5, wherein the lightly doped drain of the double poly MOS transistor is self aligned.

7. The semiconductor apparatus as set forth in claim 5, wherein:
    the double poly bipolar transistor is a PNP transistor; and
    the double poly MOS transistor is an NMOS transistor.

8. The semiconductor apparatus as set forth in claim 5, wherein:
    the double poly bipolar transistor is an NPN transistor; and
    the double poly MOS transistor is a PMOS transistor.

9. The semiconductor apparatus as set forth in claim 5, wherein:
    the second polysilicon layer comprises second polysilicon layer material in the double poly bipolar transistor and second polysilicon layer material in the double poly MOS transistor;
    the second polysilicon layer material in the double poly bipolar transistor comprises impurity ions of the second dopant forming the emitter of the double poly bipolar transistor; and
    the second polysilicon layer material in the double poly MOS transistor comprises impurity ions of the second dopant forming the source/drain of the double poly MOS transistor.

10. The semiconductor apparatus as set forth in claim 9, wherein the emitter of the double poly bipolar transistor is self aligned to the extrinsic base of the double poly bipolar transistor.

11. The semiconductor apparatus as set forth in claim 9, wherein the source/drain of the double poly MOS transistor is self aligned to the gate of the double poly MOS transistor.

12. The semiconductor apparatus as set forth in claim 9, wherein the second polysilicon layer material in the double poly bipolar transistor further comprises impurity ions of the second dopant forming a deep collector of the double poly bipolar transistor.

13. The semiconductor apparatus as set forth in claim 9, wherein the source/drain in the second polysilicon layer material in the double poly MOS transistor comprises separate source and drain regions.

14. The semiconductor apparatus as set forth in claim 9, wherein:
    the double poly bipolar transistor is an NPN transistor; and
    the double poly MOS transistor is a PMOS transistor.

15. The semiconductor apparatus as set forth in claim 9, wherein:
    the double poly bipolar transistor is a PNP transistor; and
    the double poly MOS transistor is an NMOS transistor.

16. A semiconductor apparatus comprising a double poly bipolar transistor and a double poly metal oxide semiconductor (MOS) transistor;
    wherein a base of the double poly bipolar transistor comprises a first dopant having a first dopant concentration, and wherein a gate of the double poly MOS transistor comprises the first dopant having the first dopant concentration; and
    wherein an emitter of the double poly bipolar transistor comprises a second dopant having a second dopant concentration, and wherein a source/drain of the double poly MOS transistor comprises the second dopant having the second dopant concentration.

17. The semiconductor apparatus as set forth in claim 16, wherein:
    the double poly bipolar transistor and the double poly MOS transistor comprise a first layer of polysilicon material;
    the first layer of polysilicon material in the double poly bipolar transistor comprises impurity ions of the first dopant forming the base of the double poly bipolar transistor, the base comprising an extrinsic base; and
    the first layer of polysilicon material in the double poly MOS transistor comprises impurity ions of the first dopant forming the gate of the double poly MOS transistor.

18. The semiconductor apparatus as set forth in claim 17, wherein:

the double poly bipolar transistor and the double poly MOS transistor further comprise a second layer of polysilicon material;

the second layer of polysilicon material in the double poly bipolar transistor comprises impurity ions of the second dopant forming the emitter of the double poly bipolar transistor; and the second layer of polysilicon material in the double poly MOS transistor comprises impurity ions of the second dopant forming the source/drain of the double poly MOS transistor.

19. The semiconductor apparatus as set forth in claim 18, further comprising:

a substrate;

impurity ions of a third dopant in the substrate forming an intrinsic base of the double poly bipolar transistor; and impurity ions of the third dopant in the substrate forming a lightly doped drain of the double poly MOS transistor.

20. The semiconductor apparatus as set forth in claim 18, wherein the second layer of polysilicon material in the double poly bipolar transistor further comprises impurity ions of the second dopant forming a deep collector of the double poly bipolar transistor.

21. An apparatus comprising:

a semiconductor substrate;

a first polysilicon layer over the substrate; and a second polysilicon layer over the first polysilicon layer;

wherein the first polysilicon layer comprises an extrinsic base of a double poly bipolar transistor and a gate of a double poly metal oxide semiconductor (MOS) transistor;

wherein the second polysilicon layer comprises an emitter of the double poly bipolar transistor and a source/drain and a deep collector of the double poly MOS transistor;

wherein the extrinsic base of the double poly bipolar transistor comprises a first dopant having a first dopant concentration, and wherein the gate of the double poly MOS transistor comprises the first dopant having the first dopant concentration;

wherein the emitter of the double poly bipolar transistor comprises a second dopant having a second dopant concentration, and wherein the source/drain of the double poly MOS transistor comprises the second dopant having the second dopant concentration; and wherein the semiconductor substrate comprises a first region having a third dopant forming an intrinsic base of the double poly bipolar transistor and a second region having the third dopant forming a lightly doped drain of the double poly MOS transistor.

* * * * *